(12) United States Patent
Wang et al.

(10) Patent No.: US 12,219,795 B2
(45) Date of Patent: Feb. 4, 2025

(54) DISPLAY SUBSTRATE, PREPARATION METHOD THEREOF, AND DISPLAY DEVICE

(71) Applicant: BOE Technology Group Co., Ltd., Beijing (CN)

(72) Inventors: Qing Wang, Beijing (CN); Kuanta Huang, Beijing (CN); Xiaochuan Chen, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 959 days.

(21) Appl. No.: 17/258,433

(22) PCT Filed: Mar. 27, 2020

(86) PCT No.: PCT/CN2020/081838
§ 371 (c)(1),
(2) Date: Jan. 6, 2021

(87) PCT Pub. No.: WO2021/189474
PCT Pub. Date: Sep. 30, 2021

(65) Prior Publication Data
US 2022/0140282 A1    May 5, 2022

(51) Int. Cl.
*H10K 50/844* (2023.01)
*H10K 59/38* (2023.01)
*H10K 71/00* (2023.01)

(52) U.S. Cl.
CPC .......... *H10K 50/844* (2023.02); *H10K 59/38* (2023.02); *H10K 71/00* (2023.02)

(58) Field of Classification Search
CPC ............. H10K 2101/80; H10K 50/844; H10K 59/873; G02F 1/133305; G02F 1/133345
See application file for complete search history.

(56) References Cited

U.S. PATENT DOCUMENTS 10,090,478 B2 * 10/2018 Ahn ..................... H10K 77/111
2006/0098153 A1 * 5/2006 Slikkerveer ....... G02F 1/133305
156/196

(Continued)

OTHER PUBLICATIONS

EP Search Report for EP20897668.8 Mailed Apr. 3, 2023.
(Continued)

*Primary Examiner* — Kyoung Lee
(74) *Attorney, Agent, or Firm* — Ling Wu; Stephen Yang; Ling and Yang Intellectual Property

(57) ABSTRACT

Provided are a display substrate and a preparation method thereof, and a display device. The display substrate includes a base substrate, a light-emitting element disposed on the base substrate, and an encapsulation layer disposed on the light-emitting element, the display substrate further comprises a driving circuit connected with the light-emitting element and configured to drive the light-emitting element, the driving circuit comprises a driving transistor which comprises an active layer located inside the base substrate; the encapsulation layer comprises a first gradient layer and a second gradient layer stacked along a direction away from the base substrate, a content of oxygen element in the first gradient layer gradually decreases, and a content of carbon element in the second gradient layer gradually increases along the direction away from the base substrate.

20 Claims, 8 Drawing Sheets

(56) References Cited

U.S. PATENT DOCUMENTS

| | | | |
|---|---|---|---|
| 2009/0058275 A1 | 3/2009 | Aota | |
| 2014/0091301 A1* | 4/2014 | Yamazaki | H01L 27/1225 257/43 |
| 2015/0137131 A1 | 5/2015 | Kim | |
| 2015/0362645 A1* | 12/2015 | Franz | G02F 1/153 359/275 |
| 2016/0095172 A1* | 3/2016 | Lee | H10K 77/111 313/504 |
| 2017/0104045 A1 | 4/2017 | Hanamura et al. | |
| 2018/0047946 A1* | 2/2018 | Tsuda | H10K 59/873 |
| 2018/0123086 A1* | 5/2018 | Oh | G09G 3/3258 |
| 2018/0130858 A1* | 5/2018 | Kim | H10K 50/125 |
| 2019/0088895 A1* | 3/2019 | Ishida | H10K 71/00 |
| 2019/0393447 A1* | 12/2019 | Yun | H10K 50/865 |

OTHER PUBLICATIONS

V. A. Gritsenko et al., "Excess silicon at the silicon nitride/thermal oxide interface in oxide-nitride-oxide structures", Journal of Appled Physics, American Institude of Phisics, Sep. 15, 1999, pp. 3234-3240, vol. 86, No. 6, XP012048630.

Lina Sun et al., "Interfacial Engineering in Solution Processing of Silicon-Based Hybrid Multilayer for High Performance Thin Film Encapsulation", Applied Materials & Interfaces, Oct. 23, 2019, pp. 43425-43432, vol. 11, No. 46, XP055946344.

\* cited by examiner

DISPLAY SUBSTRATE, PREPARATION METHOD THEREOF, AND DISPLAY DEVICE

TECHNICAL FIELD

The present disclosure relates to, but is not limited to, the field of display technology, and particularly relates to a display substrate, a preparation method thereof, and a display device.

BACKGROUND

Micro organic light-emitting diode (Micro-OLED) is a micro display developed in recent years, and silicon-based OLED is one of them. Silicon-based OLED can not only achieve the active addressing of pixels, but also allow the preparation of pixel driving circuits, timing control (TCON) circuits, over-current protection (OCP) circuits, etc. on the silicon-based substrate, which is conducive to reducing the system volume and achieving light weight. Silicon-based OLED is prepared by mature Complementary Metal Oxide Semiconductor (CMOS) integrated circuit process, which has the advantages of small size, high resolution (Pixels Per Inch, PPI) and high refresh rate, and is widely used in the near-eye display field of Virtual Reality (VR) or Augmented Reality (AR).

SUMMARY

The following is a summary of subject matter described in detail herein. This summary is not intended to limit the protection scope of the claims.

The present disclosure provides a display substrate, including a base substrate, a light-emitting element disposed on the base substrate, and an encapsulation layer disposed on the light-emitting element. The display substrate further comprises a driving circuit connected with the light-emitting element and configured to drive the light-emitting element. The driving circuit comprises a driving transistor which comprises an active layer located inside the base substrate. The encapsulation layer comprises a first gradient layer and a second gradient layer stacked along a direction away from the base substrate, wherein a content of oxygen element in the first gradient layer gradually decreases and a content of carbon element in the second gradient layer gradually increases along the direction away from the base substrate.

In some possible implementations, an element in the first gradient layer comprises silicon, oxygen and nitrogen, a material of the first gradient layer adjacent to the light-emitting element comprises silicon oxynitride, and a material of the first gradient layer away from the light-emitting element comprises silicon nitride.

In some possible implementations, an element in the second gradient layer comprises silicon, carbon and nitrogen, a material of the second gradient layer adjacent to the light-emitting element comprises silicon nitride, and a material of the second gradient layer away from the light-emitting element comprises at least one of silicon carbide and silicon carbon nitrogen.

In some possible implementations, the encapsulation layer further comprises a homogeneous layer disposed between the first gradient layer and the second gradient layer, and the content of each element in the homogeneous layer is unchanged.

In some possible implementations, a material of the homogeneous layer comprises silicon nitride.

In some possible implementations, a thickness of the first gradient layer is smaller than that of the second gradient layer, and a thickness of the homogeneous layer is smaller than that of the second gradient layer.

In some possible implementations, the display substrate further comprises a color filter layer and a protective layer. The color filter layer is disposed on the second gradient layer, and a material of the protective layer comprises at least one of silicon carbide and silicon carbon nitrogen.

The present disclosure further provides a display device, comprising the aforementioned display substrate.

The present disclosure further provides a preparation method of a display substrate, comprising: forming a driving circuit and a light-emitting element on a base substrate, wherein the driving circuit is connected with the light-emitting element and configured to drive the light-emitting element, and comprises a driving transistor which comprises an active layer located inside the base substrate; and forming an encapsulation layer by continuous deposition in a same equipment chamber, wherein the encapsulation layer comprises a first gradient layer and a second gradient layer which are sequentially formed along a direction away from the base substrate, wherein a content of oxygen element in the first gradient layer gradually decreases and a content of carbon element in the second gradient layer gradually increases along the direction away from the base substrate.

In some possible implementations, forming an encapsulation layer by continuous deposition in a same equipment chamber comprises: in the same equipment chamber, forming a first gradient layer on the light-emitting element, wherein a content of oxygen element in the first gradient layer gradually decreases along the direction away from the base substrate;

forming a homogeneous layer on the first gradient layer, wherein the content of each element in the homogeneous layer is unchanged; and forming a second gradient layer on the homogeneous layer, wherein the content of carbon element in the second gradient layer gradually increases along the direction away from the substrate.

In some possible implementations, forming the first gradient layer on the light-emitting element comprises:

adopting a silicon hydride gas, an oxygen compound gas, a nitrogen hydride gas and a nitrogen compound gas to perform film layer deposition, wherein a proportion of the oxygen compound gas in the total gas is gradually reduced to 0 in the deposition process such that the material of the first gradient layer adjacent to the light-emitting element comprises silicon oxynitride, and the material of the first gradient layer away from the light-emitting element comprises silicon nitride; and at the beginning of deposition, a proportion of the silicon hydride gas in the total gas is 2% to 6%, a proportion of the oxygen compound gas in the total gas is 14% to 22%, a proportion of the nitrogen hydride gas in the total gas is 14% to 22%, and a proportion of the nitrogen compound gas in the total gas is 50% to 70%.

In some possible implementations, forming a homogeneous layer on the first gradient layer comprises:

adopting a silicon hydride gas and a nitrogen compound gas to perform film layer deposition, and forming a silicon nitride layer on the first gradient layer.

In some possible implementations, forming a second gradient layer on the homogeneous layer comprises:

adopting a silicon hydride gas, a hydrocarbon gas, a nitrogen hydride gas and a nitrogen compound gas to perform film layer deposition, wherein a proportion of the carbon compound gas in the total gas gradually increases from 0 such that a material of the second gradient layer adjacent to the light-emitting element comprises silicon nitride, and a material of the second gradient layer away from the light-emitting element comprises at least one of silicon carbide and silicon carbon nitrogen; and at the end of deposition, a proportion of the silicon hydride gas in the total gas is 10%-15%, a proportion of the hydrocarbon gas in the total gas is 10%-15%, a proportion of the nitrogen hydride gas in the total gas is 20%-30%, and a proportion of the nitrogen compound gas in the total gas is 40%-60%.

In some possible implementations, the display substrate further comprises a display region and a bonding region. Forming an encapsulation layer by continuous deposition in a same equipment chamber comprises:

adopting a mask to form an encapsulation layer by continuous deposition in the same equipment chamber.

In some possible implementations, the preparation method further comprises:

forming a color filter layer on the encapsulation layer; and forming a protective layer on the color filter layer, wherein a material of the protective layer comprises at least one of silicon carbide and silicon carbon nitrogen.

Other aspects will become apparent upon reading and understanding the accompanying drawings and the detailed description.

BRIEF DESCRIPTION OF DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure. Shapes and sizes of the components in the drawings do not reflect real proportions, and the purpose is only for schematically describing contents of the present disclosure.

ILLUSTRATION OF REFERENCE SIGNS

Figure 1:
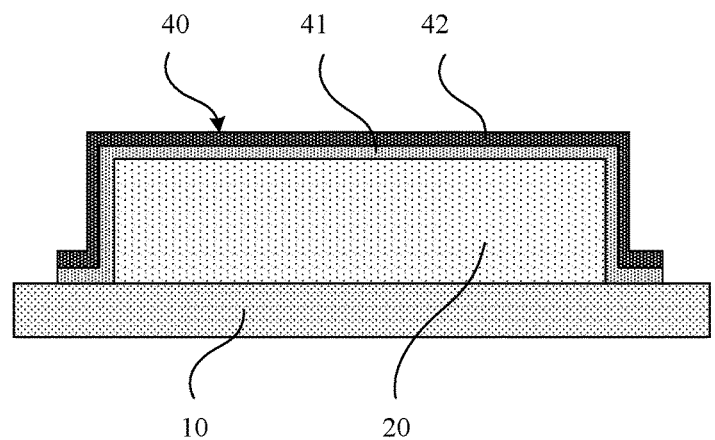
FIG. 1 is a schematic diagram of a structure of a display substrate according to the present disclosure.

| 10-silicon-based substrate; | 11-driving transistor; | 12-first insulating layer; |
|---|---|---|
| 13-first conductive pillar; | 14-connection electrode; | 15-second insulating layer; |
| 16-second conductive pillar; | 20-light-emitting element, | 21-reflective layer; |
| 22- anode layer; | 23-organic light-emitting layer; | 24-cathode layer; |
| 30-bonding pad assembly; | 31-anode; | 32-pixel definition layer; |
| 33-organic light-emitting layer; | 34-cathode; | 40-encapsulation layer, |
| 41-first gradient layer; | 42-second gradient layer; | 43-homogeneous layer; |
| 50-color filter layer; | 60-cover panel; | 70-sealant; |
| 80-protective layer, | 100-display region; | 101-pixel driving circuit; |
| 102-light-emitting device; | 110-voltage driving circuit; | 200-peripheral region; |
| 201-power supply electrode; | 202-first intermediate electrode; | 203-second intermediate electrode; |
| 300-bonding region; | 301-bonding electrode; | 302-bonding via hole. |

DETAILED DESCRIPTION

To make the objects, technical solutions and advantages of the present disclosure more clear, embodiments of the present disclosure will be described in detail below with reference to the accompanying drawings. The embodiments may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of a constituent element, or the thickness or area of a layer, is sometimes exaggerated for clarity. Therefore, implementations of the present disclosure are not necessarily limited to the size shown, and the shape and size of components in the drawings do not reflect real proportions. In addition, the drawings schematically show ideal examples, and implementations of the present disclosure are not limited to the shapes or values shown in the drawings.

The "first", "second", "third" and other ordinal numbers in the present specification are used to avoid confusion of constituent elements, but not to limit in quantity.

In the present specification, for convenience, words indicating orientation or positional relationship, such as "middle", "upper", "lower", "front", "rear", "vertical", "horizontal", "top", "bottom", "inner" and "outer" are used to indicate the positional relationship of components with reference to the drawings, only for convenience of description of the present specification and simplify the description, but do not for indicating or implying that the device or element must have a specific orientation and must be constructed and operated in a specific orientation, so they cannot be understood as a limitation of the present disclosure. The positional relationship of the components is appropriately changed according to the direction in which each component is described. Therefore, they can be changed properly according to specific situations without being limited to the words described in the specification.

In the present specification, the terms "installed", "connected" and "coupled" shall be broadly understood unless otherwise explicitly specified and defined. For example, it may be fixedly connected, or removable connected, or integrally connected; it may be mechanically connected, or electrically connected; it may be directly connected, or indirectly connected through middleware, or internal connection between two elements. For those of ordinary skill in the art, the specific meanings of the above terms in the present disclosure may be understood according to a specific situation.

In the present specification, transistor refers to an element including at least three terminals, namely a gate electrode, a drain electrode and a source electrode. The transistor comprises a channel region between a drain electrode (drain electrode terminal, drain region or drain electrode) and a source electrode (source electrode terminal, source region or source electrode), and current can flow through the drain electrode, the channel region and the source electrode. In the present specification, the channel region refers to a region through which current mainly flows.

In the present specification, possibly the first electrode serves as the drain electrode and the second electrode as the source electrode, or the first electrode serves as the source electrode and the second electrode as the drain electrode. The functions of the "source electrode" and the "drain electrode" are sometimes interchanged when transistors with opposite polarities are used or when the current direction changes during circuit operation. Therefore, in the present specification, "source electrode" and "drain electrode" can be interchanged.

In the present specification, "connection" includes the case where the components are connected together through an element with certain electrical effects. The "element with certain electrical effects" is not particularly limited as long as it can transmit and receive electrical signals between connected components. Examples of "element with certain electrical effects" include not only electrodes and wiring, but also switching elements such as transistors, resistors, inductors, capacitors, and other elements with various functions.

In the present specification, "parallel" refers to a state in which two straight lines form an angle of −10 degrees or more and 10 degrees or less, and thus also includes a state in which the angle is −5 degrees or more and 5 degrees or less. In addition, "vertical" refers to a state in which an angle of 80 degrees or more and 100 degrees or less is formed between two straight lines, and thus also includes a state of an angle being 85 degrees or more and 95 degrees or less.

In the present specification, "film" and "layer" can be interchanged. For example, sometimes "conductive layer" can be replaced by "conductive film". Similarly, "insulating film" can sometimes be replaced by "insulating layer".

A silicon-based OLED display device comprises a silicon-based substrate integrated with a driving circuit, an OLED light-emitting element formed on the silicon-based substrate, a film encapsulation structure wrapping the OLED light-emitting element, and a cover panel providing a protection function. As water and oxygen from outside air invade the OLED light-emitting element, organic light-emitting materials and metal electrodes will be eroded by water and oxygen, and oxidation reactions will occur, which will cause pixels to shrink or not emit light, and the performance of the device will deteriorate, thereby affecting the service life of the display device. Therefore, the encapsulation effect of the film encapsulation structure to block water and oxygen is extremely important. In traditional display devices (such as mobile phones), the film encapsulation structure adopts a three-layer stacked encapsulation structure and a dam (DAM) structure. The three-layer stacked encapsulation structure includes two inorganic layers and an organic layer disposed between the two inorganic layers. The dam structure is disposed around the display region to extend the path of water and oxygen invasion. Because silicon-based OLEDs are often very small, only a few tenths of an inch, the effect of dam structure on delaying water and oxygen intrusion is weak. Therefore, the film encapsulation structure of traditional display devices is not suitable for silicon-based OLEDs.

A preparation method of a silicon-based OLED display device comprises: first preparing multiple display substrates on a display motherboard, wherein each display substrate comprises an OLED light-emitting element disposed on a silicon-based substrate and an encapsulation film layer covering the OLED light-emitting element; and then cutting the display motherboard to form multiple display substrates. The research shows that although there are many encapsulation modes, they all have the problems of complex process and low quality, which are not suitable for mass production. For example, one encapsulation mode is to use thermal evaporation equipment, chemical vapor deposition (CVD) equipment and inkjet printing equipment to form multiple encapsulation film layers, which is not suitable for mass production because of the need of a variety of equipment, complicated process and long tact time. As another example, another encapsulation mode is to use atomic layer deposition (ALD) equipment to directly form multiple encapsulation film layers, which is not suitable for mass production because the film layers have great stress of the films, which are prone to microcracks or peeling problems, and low deposition rate. In addition, for ALD equipment or molecular layer deposition (MLD) equipment, because the size of the silicon-based OLED panel is small, it is difficult to achieve effective shielding by using a mask. Therefore, the mask is not used in the film forming process, and the formed encapsulation film layer is full-faced.

As the encapsulation film is full-faced, during the subsequent cutting of the display motherboard, the encapsulation film will be cut along with the display substrate, and many cracks will occur at the edge of the encapsulation film. Water and oxygen in the outside air will invade from the cracks, which will affect the reliability of the module and lead to failure in encapsulation. Because the encapsulation film is a full-faced structure covering the display region and the bonding region, it is necessary to add a process of opening the bonding region to facilitate the subsequent module bonding operation. In the process of opening the encapsulation film, cracks will also occur in the encapsulation film, which will lead to the invasion of external water and oxygen and affect the reliability of the module. In addition, the tact time of ALD or MLD is long, and periodic maintenance (PM) of the chamber is very difficult. Residual film fragments are easy to appear in the chamber, which will lead to encapsulation failure or display failure and increase the risk of product failure.

The present disclosure provides a display substrate, comprising a base substrate, a light-emitting element disposed on the base substrate, and an encapsulation layer disposed on the light-emitting element. The display substrate further comprises a driving circuit connected with the light-emitting element and configured to drive the light-emitting element. The driving circuit comprises a driving transistor which comprises an active layer located inside the base substrate. The encapsulation layer comprises a first gradient layer and a second gradient layer stacked along a direction away from the base substrate, wherein a content of oxygen element in the first gradient layer gradually decreases and a content of carbon element in the second gradient layer gradually increases along the direction away from the base substrate.

In some possible implementations, an element in the first gradient layer comprises silicon, oxygen and nitrogen, a material of the first gradient layer adjacent to the light-emitting element comprises silicon oxynitride, and a material of the first gradient layer away from the light-emitting element comprises silicon nitride.

In some possible implementations, an element in the second gradient layer comprises silicon, carbon and nitrogen, a material of the second gradient layer adjacent to the light-emitting element comprises silicon nitride, and a material of the second gradient layer away from the light-emitting element comprises at least one of silicon carbide and silicon carbon nitrogen.

In some possible implementations, the encapsulation layer further comprises a homogeneous layer disposed between the first gradient layer and the second gradient layer, and the content of each element in the homogeneous layer is unchanged.

In some possible implementations, a material of the homogeneous layer comprises silicon nitride.

In some possible implementations, a thickness of the first gradient layer is smaller than that of the second gradient layer, and a thickness of the homogeneous layer is smaller than that of the second gradient layer.

In some possible implementations, the display substrate further comprises a color filter layer and a protective layer. The color filter layer is disposed on the second gradient layer, the protective layer is disposed on the color filter layer, and a material of the protective layer comprises at least one of silicon carbide and silicon carbon nitrogen.

FIG. 1 is a schematic diagram of a structure of a display substrate according to the present disclosure. As shown in FIG. 1, the display substrate comprises a silicon-based substrate 10 as a base substrate, a light-emitting element 20 disposed on the silicon-based substrate 10, and an encapsulation layer 40 wrapping the light-emitting element 20. The silicon-based substrate 10, also called an IC wafer, is integrated with a driving circuit. The driving circuit includes a pixel driving circuit for generating driving signals, a gate driving circuit for generating gate driving signals and a data driving circuit for generating data signals. The pixel driving circuit is connected with the light-emitting element and configured to drive the light-emitting element. The pixel driving circuit includes a driving transistor. The driving transistor includes an active layer located inside the silicon-based substrate. The light-emitting element 20 includes an anode layer, an organic light-emitting layer and a cathode layer stacked on the silicon-based substrate 10. An encapsulation layer 40 wrapping the light-emitting element 20 means that the encapsulation layer 40 is disposed on an upper surface of the light-emitting element 20 on one side away from the silicon-based substrate 10 and on all side surfaces of the light-emitting element 20, so that the encapsulation layer 40 and the silicon-based substrate 10 form a sealed space in which the light-emitting element 20 is disposed. In the plane parallel to and perpendicular to the silicon-based substrate 10, an orthographic projection of the encapsulation layer 40 on the silicon-based substrate 10 includes an orthographic projection of the light-emitting element 20 on the silicon-based substrate 10. In the present disclosure, the encapsulation layer 40 includes a first gradient layer 41 wrapping the light-emitting element 20 and a second gradient layer 42 wrapping the first gradient layer 41. The content of oxygen in the first gradient layer 41 gradually decreases and the content of carbon in the second gradient layer 42 gradually increases along the direction away from the silicon-based substrate 10, forming a film encapsulation structure with material functional gradient change.

Figure 2:
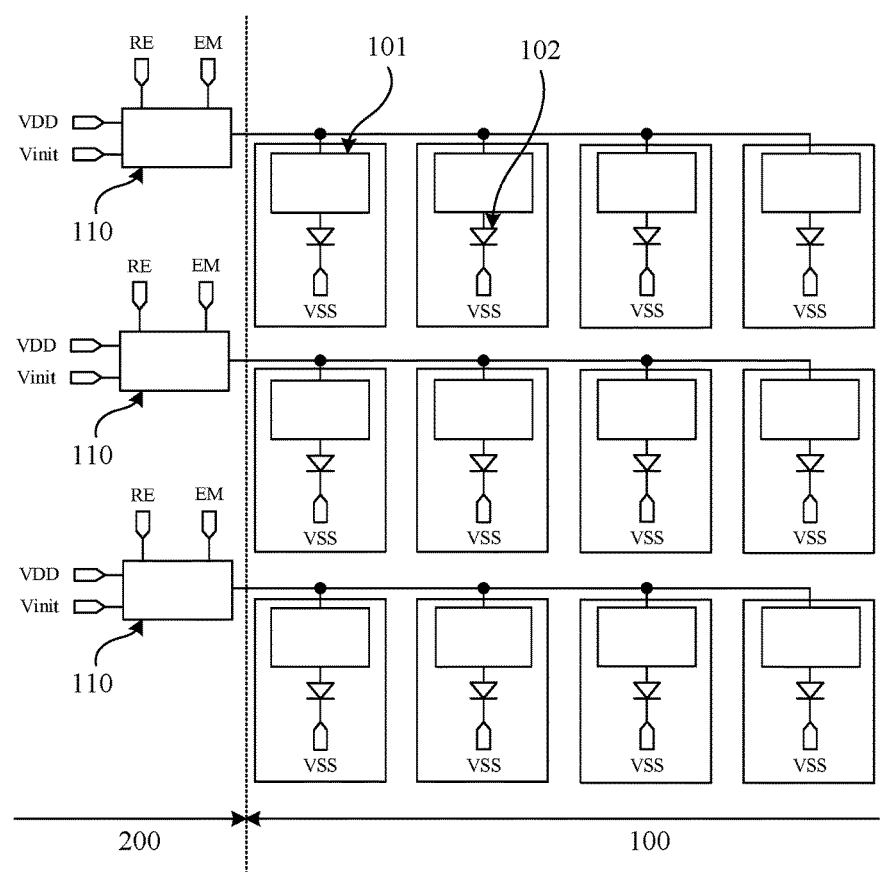
FIG. 2 is a schematic diagram of a circuit principle of a silicon-based substrate according to the present disclosure.

FIG. 2 is a schematic diagram of a circuit principle of a silicon-based substrate according to the present disclosure. As shown in FIG. 2, the silicon-based substrate 10 includes a plurality of display units located in a display region 100 (region AA) and a driving circuit located in a peripheral region 200. The plurality of display units in the display region 100 are regularly disposed to form a plurality of display rows and a plurality of display columns. Each display unit includes a pixel driving circuit 101 and a light-emitting device 102 connected with the pixel driving circuit 101. The pixel driving circuit 101 includes at least a driving transistor. The driving circuit includes at least a plurality of voltage driving circuits 110, and each of the voltage driving circuits 110 is connected with a plurality of pixel driving circuits 101. For example, a voltage driving circuit 110 is connected with a pixel driving circuit 101 in a display row, the first electrodes of the driving transistors in the pixel driving circuit 101 in the display row are commonly connected with the voltage driving circuit 110, the second electrode of each driving transistor is connected with the anode of the light-emitting device 102 of the display unit, and the cathode of the light-emitting device 102 is connected with the input terminal of the second power signal VSS. The voltage driving circuit 110 is respectively connected with the input terminal of the first power signal VDD, the input terminal of the initialization signal Vinit, the input terminal of the reset control signal RE and the input terminal of the light emission control signal EM. The voltage driving circuit 110 is configured to output the initialization signal Vinit to the first electrode of the driving transistor in response to the reset control signal RE to control the corresponding light-emitting device 102 to reset. The voltage driving circuit 110 is further configured to output the first power signal VDD to the first electrode of the driving transistor in response to the light emission control signal EM to drive the light-emitting device 102 to emit light. By connecting the pixel driving circuits 101 in one display row commonly with the voltage driving circuit 110, the structure of the pixel driving circuit 101 in the display region 100 can be simplified, and the occupied area of the pixel driving circuit 101 in the display region 100 can be reduced, so that more pixel driving circuits 101 and light-emitting devices 102 can be disposed in the display region 100, thereby achieving high PPI display. The voltage driving circuit 110 outputs the initialization signal Vinit to the first electrode of the driving transistor under the control of the reset control signal RE, and controls the corresponding light-emitting device 102 to reset, which can avoid the influence of the voltage applied to the light-emitting device 102 during the light emission of a frame on the light emission of the next frame and improve the afterimage phenomenon.

In an exemplary embodiment, three display units of different colors make up one pixel, and the three display units can be red display unit, green display unit and blue display unit, respectively. In some possible implementations, one pixel can include four, five or more display units, which can be designed and determined according to the actual application environment, and is not limited here. In some possible implementations, one voltage driving circuit 110 may be connected with the pixel driving circuits 101 in two adjacent display units in the same display row, or may be connected with the pixel driving circuits 101 in three or more display units in the same display row, which is not limited here.

Figure 3:
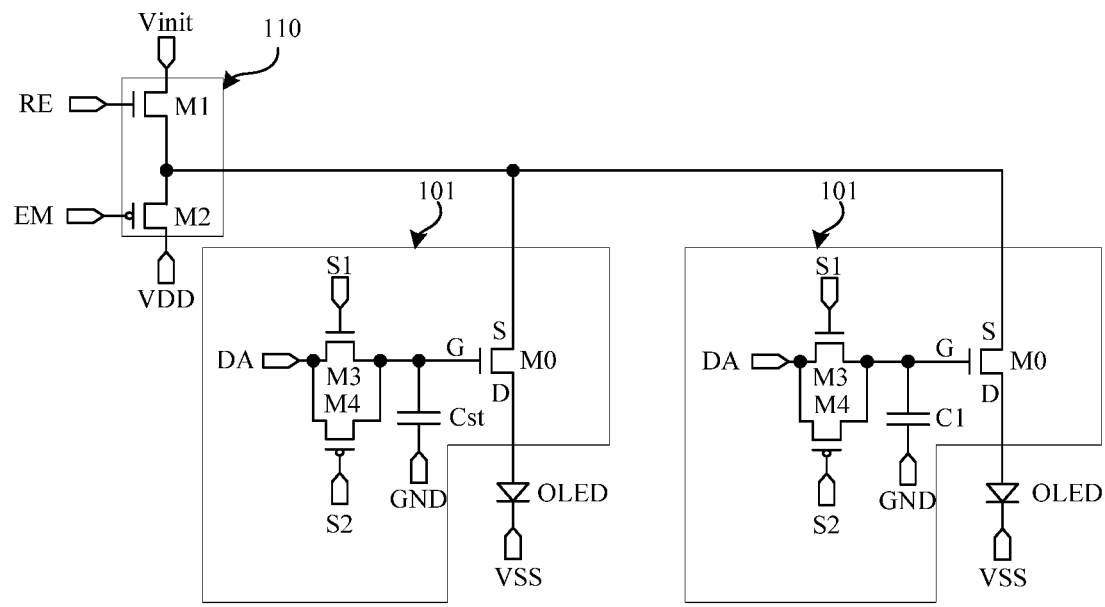
FIG. 3 is a schematic diagram of a circuit implementation of a voltage driving circuit and a pixel driving circuit according to the present disclosure.

FIG. 3 is a schematic diagram of a circuit implementation of a voltage driving circuit and a pixel driving circuit according to the present disclosure. As shown in FIG. 3, the light-emitting device may include an OLED, the anode of which is connected with the second electrode D of the driving transistor M0, and the cathode of which is connected with the input terminal of the second power signal VSS. The voltage of the second power signal VSS is generally negative voltage or ground voltage $V_{GND}$ (generally 0V), and the voltage of the initialization signal Vinit may also be disposed to be ground voltage $V_{GND}$. In an exemplary embodiment, the OLED may be a micro-OLED or a mini-OLED, which is beneficial to achieve high PPI display.

In an exemplary embodiment, the voltage driving circuit 110 is connected with two pixel driving circuits 101 in a display row, the pixel driving circuits 101 each include a driving transistor M0, a third transistor M3, a fourth transistor M4 and a storage capacitor Cst, and the voltage driving circuit 110 includes a first transistor M1 and a second transistor M2. A driving transistor M0, a first transistor M1, a second transistor M2, a third transistor M3, and a fourth transistor M4 are all metal oxide semiconductor (MOS) field-effect transistor prepared in a silicon-based substrate.

The control electrode of the first transistor M1 is connected with the input terminal of the reset control signal RE for receiving reset control signals RE, the first electrode of the first transistor M1 is connected with the input terminal of the initialization signal Vinit for receiving initialization signals Vinit, and the second electrode of the first transistor M1 is connected with the first electrode s of the corresponding driving transistor M0 and the second electrode of the second transistor M2 respectively. The control electrode of the second transistor M2 is connected with the input terminal of the light emission control signal EM for receiving the light emission control signal EM, and the first electrode of the second transistor M2 is connected with the input terminal of the first power signal VDD for receiving the first power signal VDD. The second electrode of the second transistor M2 is respectively connected with the first electrode S of the corresponding driving transistor M0 and the second electrode of the first transistor M1. In an exemplary embodiment, the type of the first transistor M1 may be different from that of the second transistor M2, with the first transistor M1 being an N-type transistor and the second transistor M2 being a P-type transistor, or the first transistor M1 being an P-type transistor and the second transistor M2 being an N-type transistor. In some possible implementations, the type of the first transistor M1 may be the same as that of the second transistor M2, which can be designed and determined according to the actual application environment, and is not limited here.

The pixel driving circuit 101 includes a driving transistor M0, a third transistor M3, a fourth transistor M4 and a storage capacitor Cst. The control electrode G of the driving transistor M0 and the first electrode S of the driving transistor M0 are connected with the second electrode of the first transistor M1 and the second electrode of the second transistor M2, and the second electrode D of the driving transistor M0 is connected with the anode of the OLED. The control electrode of the third transistor M3 is connected with the input terminal of the first scanning signal S1 for receiving the first scanning signal S1, the first electrode of the third transistor M3 is connected with the input terminal of the data signal DA for receiving the data signal DA, and the second electrode of the third transistor M3 is connected with the control electrode G of the driving transistor M0. The control electrode of the fourth transistor M4 is connected with the input terminal of the second scanning signal S2 for receiving the second scanning signal S2, the first electrode of the fourth transistor M4 is connected with the input terminal of the data signal DA for receiving the data signal DA, and the second electrode of the fourth transistor M4 is connected with the control electrode G of the driving transistor M0. The first terminal of the storage capacitor Cst is connected with the control electrode G of the driving transistor M0, and the second terminal of the storage capacitor Cst is connected with the ground terminal GND. In an exemplary embodiment, the driving transistor M0 may be an N-type transistor, and the type of the third transistor M3 may be different from that of the fourth transistor M4, for example, the third transistor M3 is an N-type transistor and the fourth transistor M4 is a P-type transistor. If the voltage of the data signal DA is a voltage corresponding to a high gray scale, the voltage of the data signal DA can be prevented from being affected by, for example, the threshold voltage of the N-type third transistor M3 by turning on the P-type fourth transistor M4 to transmit the data signal DA to the control electrode G of the driving transistor M0. If the voltage of the data signal DA is a voltage corresponding to a low gray scale, the voltage of the data signal DA can be prevented from being affected by the threshold voltage of the P-type fourth transistor M4 by turning on the N-type third transistor M3 to transmit the data signal DA to the control electrode G of the driving transistor M0. In this way, the voltage range input to the control electrode G of the driving transistor M0 can be increased. In some possible implementations, the types of the third transistor M3 and the fourth transistor M4 may be: the third transistor M3 is a P-type transistor and the fourth transistor M4 is an N-type transistor. In some possible implementations, the pixel driving circuit may be a 3T1C, 5T1C or 7T1C circuit structure, or may be a circuit structure with internal compensation or external compensation function, which is not limited in the present disclosure.

Figure 4:
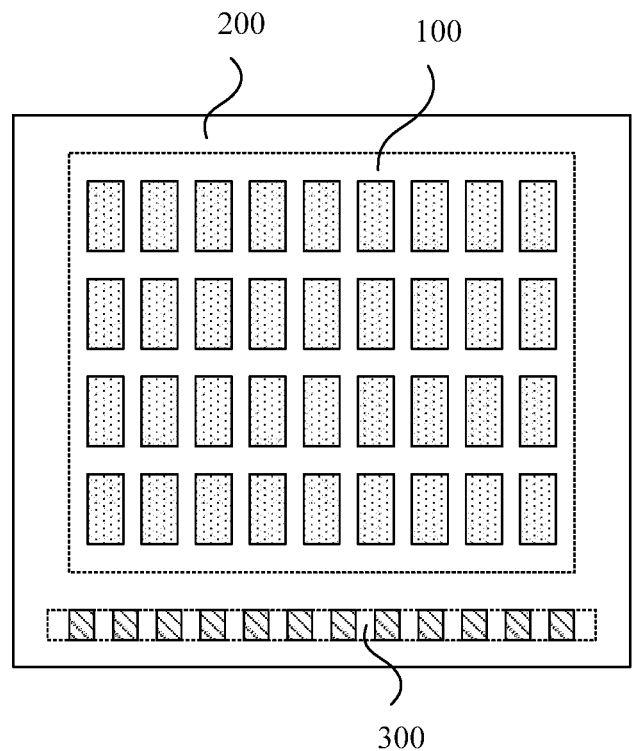
FIG. 4 is a schematic plan view of a structure of a display substrate according to the present disclosure.
Figure 5:
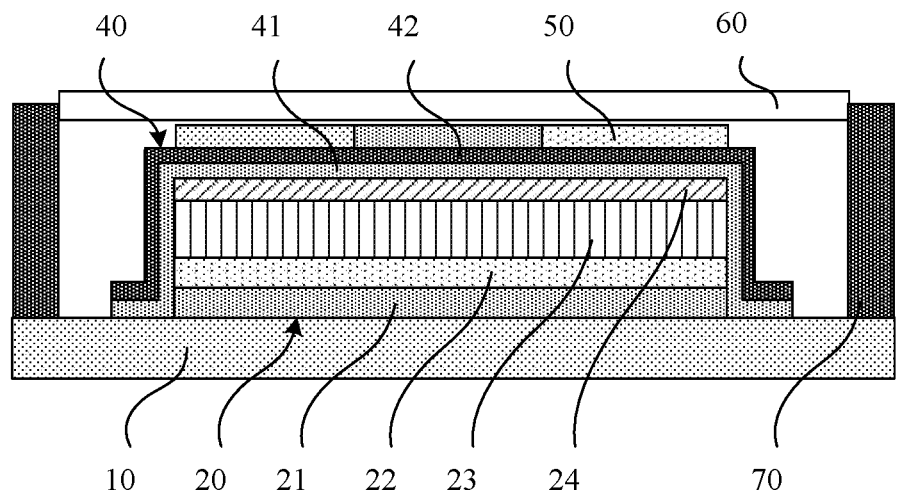
FIG. 5 is a schematic cross-sectional view of a display substrate shown in FIG. 4.

FIG. 4 is a schematic plan view of a structure of a display substrate according to the present disclosure, and FIG. 5 is a schematic cross-sectional view of a display region in the display substrate shown in FIG. 4. As shown in FIG. 4, in a plane parallel to the display substrate, the display substrate includes a display region 100, a peripheral region 200 located at the periphery of the display region 100 and a bonding region 300 located inside the peripheral region 200 and at a side of the peripheral region 200 adjacent to the display region 100. The display region 100 is provided with a plurality of display units disposed regularly, the peripheral region 200 is provided with a cathode ring, and the bonding region 300 is provided with a bonding pad assembly for bonding and connecting with an external flexible circuit board (FPC) or wire (Wire). As shown in FIG. 5, in a plane perpendicular to the display substrate, the display region of the display substrate includes a silicon-based substrate 10, a light-emitting element 20 disposed on the silicon-based substrate 10, an encapsulation layer 40 disposed on the light-emitting element 20, and a color filter layer 50 disposed on the encapsulation layer 40. The light-emitting element 20 includes a reflective layer 21, an anode layer 22, an organic light-emitting layer 23 and a cathode layer 24 stacked on the silicon-based substrate 10. The reflective layer 21 is used to form a micro-cavity structure with the cathode layer 24, so that the light directly emitted by the organic light-emitting layer 23 and the light reflected by the reflective layer 21 interfere with each other, thereby improving the color gamut of the emitted light and enhancing the brightness of the emitted light. In an exemplary embodiment, the light-emitting element 20 may further include a pixel defining layer or a flat layer.

The encapsulation layer 40 of the present disclosure includes a first gradient layer 41 and a second gradient layer 42 stacked on the light-emitting element 20 along the direction away from the silicon-based substrate 10. Along the direction away from the silicon-based substrate 10, the content of oxygen element in the first gradient layer 41 gradually decreases, and the content of carbon element in the second gradient layer 42 gradually increases, forming a film encapsulation structure with material functional gradient change.

According to the display substrate of the present disclosure, the mode of white light+color filter is adopted to achieve full-color display, and the Color Filter (CF) layer 50 is located on the encapsulation layer 40 and comprises a first color unit, a second color unit and a third color unit corresponding to the display units. According to the present disclosure, a high resolution of more than 2000 can be achieved by adopting the mode of white light+color filter, and the requirements of VR/AR can be met.

The display substrate of the present disclosure also includes a cover panel 60 disposed above the color filter layer 50, which can achieve the function of protecting the color filter 50, provide further guarantee for blocking the invasion of water and oxygen, and greatly prolong the service life of the silicon-based OLED display substrate. In an exemplary embodiment, a sealant 70 may be disposed on the side of the cover panel 60, and the peripheral sides of the cover panel 60 and the silicon-based substrate 10 are sealed by the sealant 70. The end face of the sealant 70 at the side away from the silicon-based substrate 10 is located between the surface of the cover panel 60 at the side adjacent to the silicon-based substrate 10 and the surface of the cover panel 60 at the side away from the silicon-based substrate 10, thereby ensuring the sealing effect and preventing the increase of the thickness of the display substrate due to the sealant higher than the cover panel. In another exemplary embodiment, the sealant 70 may be disposed between the silicon-based substrate 10 and the cover panel 60. In an exemplary embodiment, the cover panel 60 is disposed in the display region 100, which can better achieve alignment and sealing, and avoid cracking of the cover panel during cutting.

Figure 6:
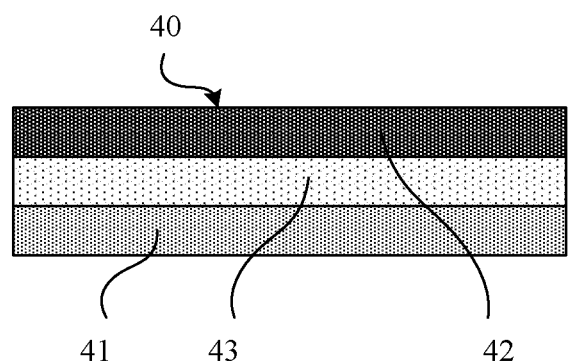
FIG. 6 is a schematic diagram of a structure of an encapsulation layer in a display substrate according to the present disclosure.

FIG. 6 is a schematic diagram of a structure of an encapsulation layer in a display substrate according to the present disclosure. As shown in FIG. 6, the encapsulation layer 40 of the present disclosure includes a first gradient layer 41, a homogeneous layer 43, and a second gradient layer 42 sequentially stacked along the direction away from the silicon-based substrate, i.e., the first gradient layer 41 is disposed on the light-emitting element 20, the homogeneous layer 43 is disposed on the first gradient layer 41, and the second gradient layer 42 is disposed on the homogeneous layer 43. Along the direction away from the silicon-based substrate, the content of oxygen element in the first gradient layer 41 gradually decreases, the content of each element in the homogeneous layer 43 remains unchanged, and the content of carbon element in the second gradient layer 42 gradually increases, forming a film encapsulation structure with material function gradient change.

In an exemplary embodiment, the material of the first gradient layer 41 includes a silicon compound, an oxygen compound and a nitrogen compound, and the content of the oxygen compound in the first gradient layer 41 gradually decreases along the direction from the first gradient layer 41 to the homogeneous layer 43. On the side away from the homogeneous layer 43, the material of the first gradient layer 41 is silicon oxynitride (SiONx), and on the side adjacent to the homogeneous layer 43, the material of the first gradient layer 41 is silicon nitride (SiNx). The material of the homogeneous layer 43 includes a silicon compound and a nitrogen compound, the contents of which are unchanged, and the material of the homogeneous layer 43 is SiNx. The material of the second gradient layer 42 includes a silicon compound, a carbon compound and a nitrogen compound. The content of the carbon compound in the second gradient layer 42 gradually increases along the direction that the second gradient layer 42 is away from the homogeneous layer 43. On the side adjacent to the homogeneous layer 43, the material of the second gradient layer 42 is SiNx, and on the side away from the homogeneous layer 43, the material of the second gradient layer 42 is silicon carbide (SiC) or silicon carbon nitrogen (SiCNx).

The structure of the display substrate is described below through an example of a preparation process of the display substrate. The "patterning process" mentioned in the present disclosure includes processes, such as film layer deposition, photoresist coating, mask exposure, development, etching and photoresist stripping. Deposition may be implemented by any one or more of sputtering, evaporation and chemical vapor deposition, coating may be implemented by any one or more of spraying and spin coating, and etching may be implemented by any one or more of dry etching and wet etching. "Film" refers to a layer of film fabricated by a certain material on a substrate by using deposition or coating process. If the "film" does not need a patterning process during the whole manufacturing process, the "film" can also be called a "layer". If the "film" needs a patterning process throughout the whole manufacturing process, it is referred to as a "film" before the patterning process and as a "layer" after the patterning process. The "layer" after the patterning process contains at least one "pattern". In the present disclosure, "A and B are disposed on the same layer" means that A and B are formed simultaneously by the same patterning process. In the present disclosure, "orthographic projection of A includes orthographic projection of B" means that orthographic projection of B falls within the range of orthographic projection of A, or orthographic projection of A covers orthographic projection of B.

Figure 7:
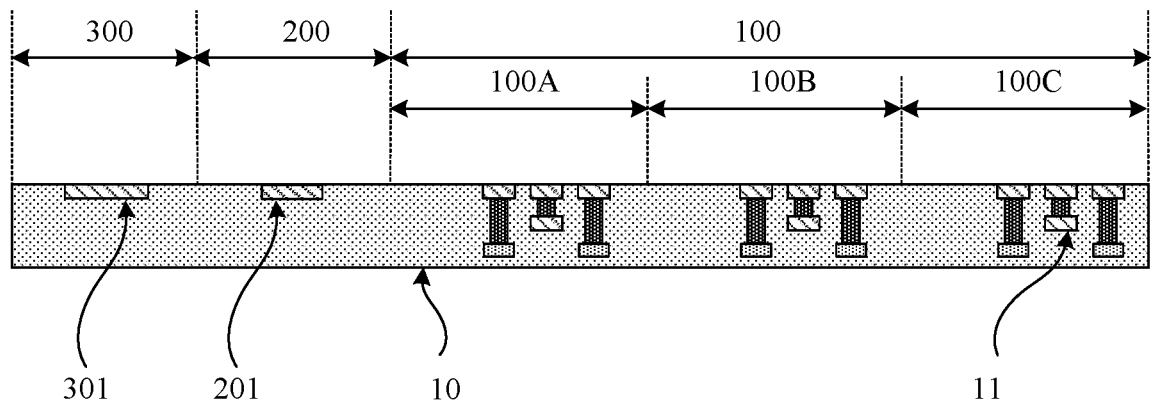
FIG. 7 is a schematic diagram of a display substrate after a silicon-based substrate is prepared according to the present disclosure.

(1) A silicon-based substrate 10 is prepared. The silicon-based substrate 10 includes a display region 100, a peripheral region 200 and a bonding region 300. The display region 100 includes a plurality of display units, and the silicon-based substrate 10 of each display unit is integrated with a pixel driving circuit which can be a 2T1C, 3T1C, 5T1C or 7T1C circuit structure or a circuit structure with internal compensation or external compensation function. The pixel driving circuit includes at least a first scanning line for transmitting a first scan signal, a first power line for transmitting a first power signal, a data line for transmitting a data signal, a switching transistor and a driving transistor. The peripheral region 200 is disposed at the periphery of the display region 100, a second power line for transmitting a second power signal and a power supply assembly are integrated in the silicon-based substrate 10 of the peripheral region 200, and the second power signal is connected with the power supply assembly. The bonding region 300 is disposed on the side of the peripheral region 200 away from the display region 100, and a bonding pad assembly is integrated in the silicon-based substrate 10 of the bonding region 300. The bonding pad assembly is respectively connected with the first scanning line for transmitting the first scanning signal, the first power line for transmitting the first power signal, the second power line for transmitting the second power signal and the data line for transmitting the data signal, as shown in FIG. 7. As an exemplary illustration, three display units of the display region 100 are illustrated in FIG. 7: first display unit 100A, second display unit 100B and third display unit 100C. In each display unit, the pixel driving circuit of the silicon-based substrate 10 is illustrated by a driving transistor 11, the power supply assembly of the silicon-based substrate 10 in the peripheral region 200 is illustrated by a power supply electrode 201, and the bonding pad assembly of the silicon-based substrate 10 in the bonding region 300 is illustrated by a bonding electrode 301. In an exemplary embodiment, the silicon-based substrate 10 includes a silicon substrate (base substrate) and a circuit layer disposed on the silicon substrate. In the display region 100, the silicon substrate includes a source connection area and a drain connection area of the active layer of the switching transistor and a source connection area and a drain connection area of the active layer of the driving transistor. The circuit layer includes a first oxide insulating layer covering the connection area and the drain connection area, a gate metal layer disposed on the first oxide insulating layer, a second oxide insulating layer covering the gate metal layer, and a source/drain metal layer disposed on the second oxide insulating layer. The gate metal layer includes at least a first scanning line, a gate electrode of the switching transistor and a gate electrode of the driving transistor, and the source/drain metal layer includes at least a first power line, a data line, source and drain electrodes of the switching transistor, and source and drain electrodes of the driving transistor. The source and drain electrodes are respectively connected with the source and drain connection areas of the corresponding transistors through conductive pillar, and a conductive channel is formed between the source and drain connection areas. The first power line is connected with the source electrode of the driving transistor, the data line is connected with the source electrode of the switching transistor, the first scanning line is connected with the gate electrode of the switching transistor, and the drain electrode of the switching transistor is connected with the gate electrode of the driving transistor through the conductive pillar. The switching transistor is configured to receive the data signal transmitted by the data line under the control of the first scanning signal output by the first scanning line, so that the gate electrode of the driving transistor receives the data signal. The driving transistor is configured to generate corresponding current at the drain electrode under the control of the data signal received by the gate electrode thereof so as to drive the light-emitting element to emit light with corresponding brightness. In the peripheral region 200, the circuit layer includes a first oxide insulating layer and a second oxide insulating layer disposed on a silicon substrate, and a power supply electrode 201 and a second power line disposed on the second oxide insulating layer. The power supply electrode 201 is connected with the second power line, and the power supply electrode 201 is used for supplying voltage to the cathode of the light-emitting element. In the bonding region 300, the circuit layer includes a first oxide insulating layer and a second oxide insulating layer disposed on the silicon substrate, and a bonding electrode 301 disposed on the second oxide insulating layer. The bonding electrode 301 is connected with the aforementioned first scanning line, first power line, second power line and data line, and is used for bonding and connecting with an external flexible circuit board (FPC) or wire. Mature CMOS integrated circuit process can be used to prepare the silicon-based substrate 10, which is not limited by the present disclosure. After the preparation, the surface of the silicon-based substrate 10 exposes the drain electrode of the driving transistor 11 in the display region 100, the power supply electrode 201 in the peripheral region 200 and the bonding electrode 301 in the bonding region 300. In some possible implementations, the pixel driving circuit may further include a sensing transistor and a second scanning line.

In an exemplary embodiment, the silicon-based substrate can be made of a material comprising any one or more of silicon, germanium and a compound semiconductor. The compound semiconductor can include any one or more of silicon germanium, silicon carbide, gallium arsenide, gallium phosphide, indium phosphide, indium arsenide and indium antimonide. The silicon-based substrate can be doped or undoped.

Figure 8:
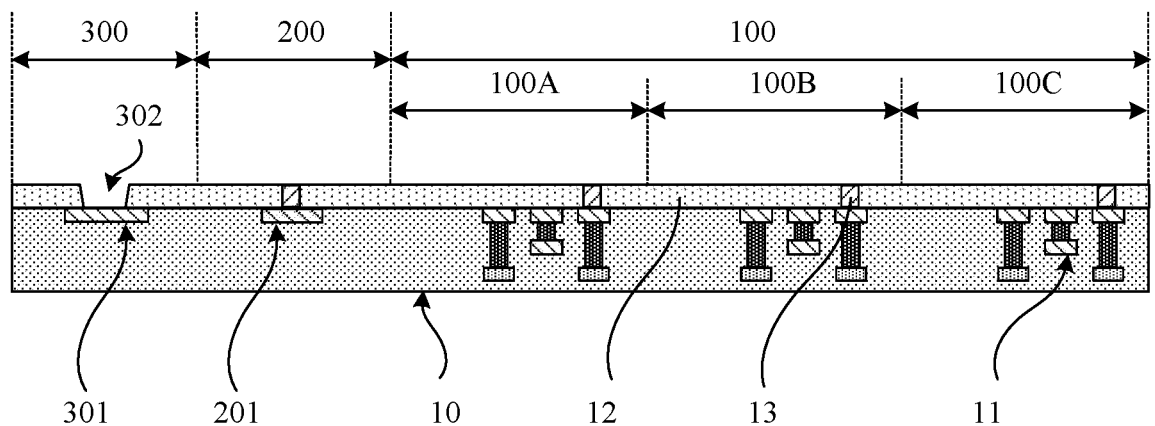
FIG. 8 is a schematic diagram of a display substrate after a first insulating layer is formed according to the present disclosure.

(2) A first insulating film is deposited on the silicon-based substrate 10, and the first insulating film is patterned by a patterning process to form a pattern of the first insulating layer 12 covering the silicon-based substrate 10. A plurality of first via holes are formed in the first insulating layer 12 of the display region 100 and the peripheral region 200, and at least one bonding via hole 302 is formed in the first insulating layer 12 of the bonding region 300. The plurality of the first via holes respectively expose the drain electrode of each display unit in the display region 100 and the power supply electrode 200 of the peripheral region 200, and the bonding via hole 302 exposes the bonding electrode 301. Then, a plurality of first conductive pillars 13 are formed in the first via hole on the first insulating layer 12. In the display region 100, the first conductive pillars 13 in the first via hole are connected with the drain electrode of the display unit, and in the peripheral region 200, the first conductive pillars 13 in the first via hole are connected with the power supply electrode 201, as shown in FIG. 8. In an exemplary embodiment, the first conductive pillar 13 may be made of a metal material. After the first conductive pillar 13 is formed by filling treatment, polishing treatment may also be carried out. The surfaces of the first insulating layer 12 and the first conductive pillar 13 are corroded and rubbed by polishing process, and partial thickness of the first insulating layer 12 and the first conductive pillar 13 is removed, so that the first insulating layer 12 and the first conductive pillar 13 form a flush surface. In some possible implementations, metal wolfram (W) may be used for the first conductive pillar 13, and the via hole filled with wolfram metal is called W-via hole. When the first insulating layer 12 has a greater thickness, the stability of the conductive path can be ensured by using W-via holes. Since the process of manufacturing W-via holes has been mature, the obtained first insulating layer 12 has better surface flatness, which is beneficial to reducing the contact resistance. In the present disclosure, W-via holes are not only suitable for connection between the silicon-based substrate 10 and the reflective layer, but also suitable for connection between the reflective layer and the anode layer, and connection between other wiring layers.

Figure 9:
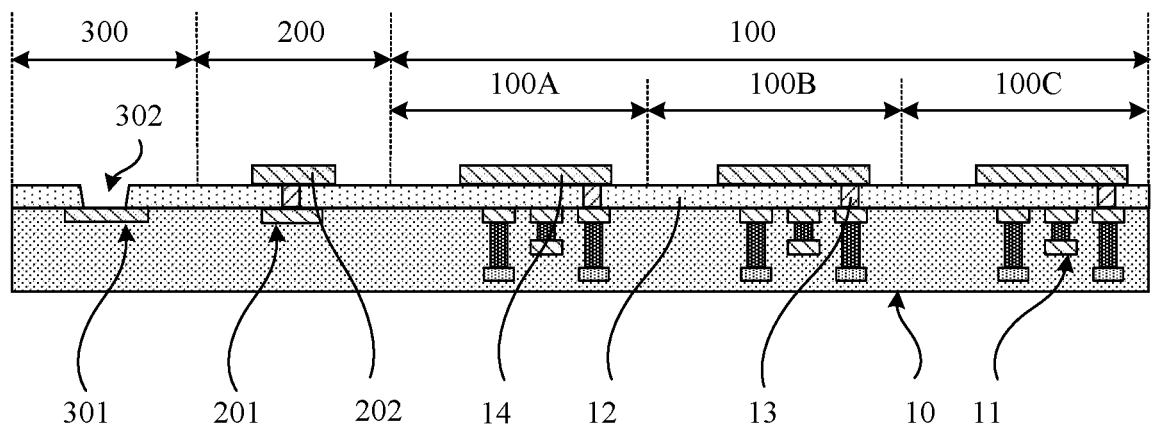
FIG. 9 is a schematic diagram of a display substrate after a connection electrode is formed according to the present disclosure.

(3) A first metal film is deposited on the silicon-based substrate 10 with the above structure formed, and the first metal film is patterned by a patterning process to form a plurality of connection electrodes 14 on the first insulating layer 12 of the display region 100, and form at least one first intermediate electrode 202 on the first insulating layer 12 of the peripheral region 200. In each display unit, the connection electrode 14 is connected with the drain electrode of the driving transistor 11 through the first conductive pillar 13, and the first intermediate electrode 202 is connected with the power supply electrode 201 through the first conductive pillar 13 as shown in FIG. 9. In an exemplary embodiment, the connection electrode 14 is used as a reflection electrode, and the connection electrode 14 of each display unit is used to form a micro-cavity structure with a cathode formed later. By using the strong reflection effect of the reflection electrode, the light directly emitted from the organic light-emitting layer interferes with the light reflected from the connection electrode, which improves the color gamut of the emitted light and enhances the brightness of the emitted light. In this patterning process, the film-layer structure of the bonding region 300 has not changed, including the first insulating layer 12 disposed on the silicon-based substrate 10. The first insulating layer 12 is provided with a bonding via hole 302 exposing the bonding electrode 301.

Figure 10:
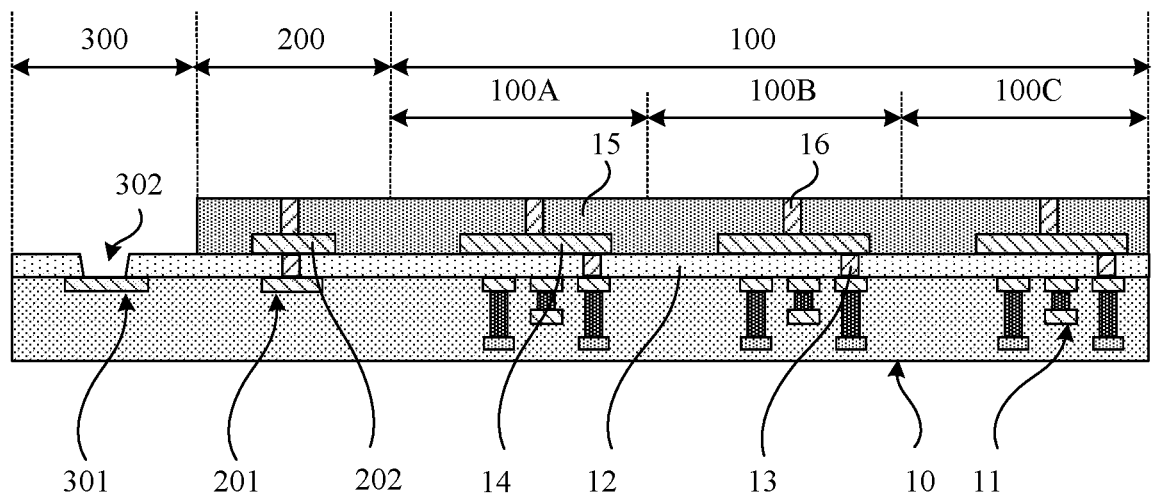
FIG. 10 is a schematic diagram of a display substrate after a second insulating layer is formed according to the present disclosure.

(4) A second insulating film is deposited on the silicon-based substrate 10 with the above structure formed, and the second insulating film is patterned by a patterning process to form a pattern of the second insulating layer 15 in the display region 100 and the peripheral region 200, and form a plurality of second via holes on the second insulating layer 15. The plurality of second via holes in the display region 100 expose the connection electrode 14 of each display unit respectively, and the second via holes in the peripheral region 200 expose the first intermediate electrode 202. Then, a plurality of second conductive pillars 16 are respectively formed in the second via holes on the second insulating layer 15. The second conductive pillars 16 in the second via holes of the display region 100 are connected with the connection electrodes 14 of the display units, and the second conductive pillars 16 in the second via holes of the peripheral region 200 are connected with the first intermediate electrode 202, as shown in FIG. 10. In an exemplary embodiment, the second conductive pillar 16 may be made of a metal material. After the second conductive pillar 16 is formed by filling treatment, polishing treatment may also be carried out. The surfaces of the second insulating layer 15 and the second conductive pillar 16 are corroded and rubbed by polishing process, and partial thickness of the second insulating layer 15 and the second conductive pillar 16 is removed, so that the second insulating layer 15 and the second conductive pillar 16 form a flush surface. In some possible implementations, metal wolfram (W) may be used for the second conductive pillar 16. In this patterning process, the bonding region 300 does not cover the second insulating layer 15, and the film-layer structure of the bonding region 300 does not change.

Figure 11:
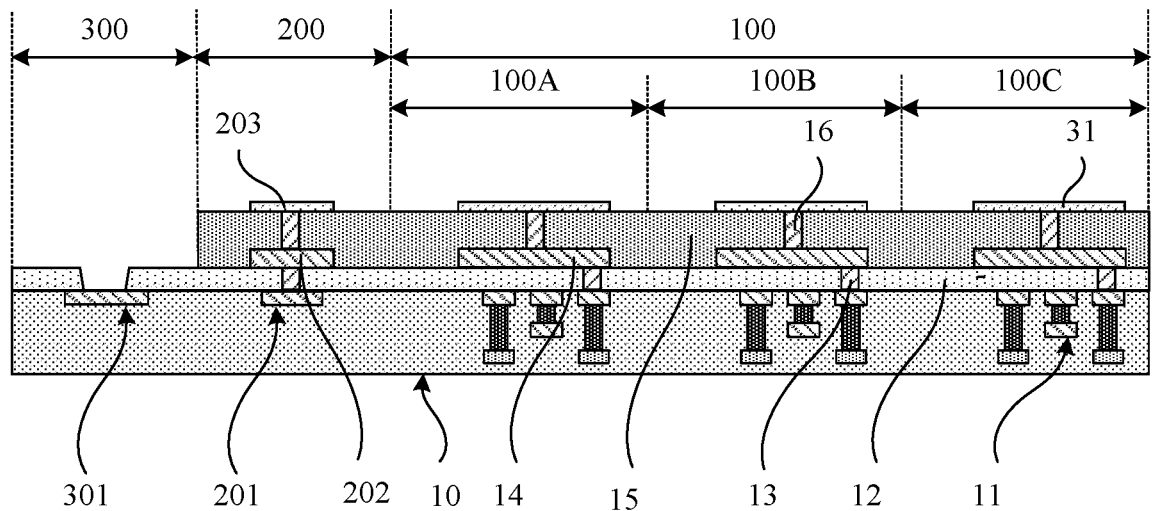
FIG. 11 is a schematic diagram of a display substrate after an anode layer is formed according to the present disclosure.

(5) A transparent conductive film is deposited on the silicon-based substrate 10 with the above structure formed, and the transparent conductive film is patterned by a patterning process to form a pattern of an anode layer on the second insulating layer 15. The anode layer includes a plurality of anodes 31 disposed in the display region 100 and a second intermediate electrode 203 disposed in the peripheral region 200. In each display unit of the display region 100, the anode 31 is connected with the connection electrode 14 through the second conductive pillar 16, and the second intermediate electrode 203 in the peripheral region 200 is connected with the first intermediate electrode 202 through the second conductive pillar 16, as shown in FIG. 11. In the present disclosure, the anode 31 is connected with the connection electrode 14 through the second conductive pillar 16, and the connection electrode 14 is connected with the drain electrode of the driving transistor 11 through the first conductive pillar 13, so that the electrical signal provided by the pixel driving circuit is transmitted to the anode 31 through the connection electrode 14. The connection electrode 14 forms a conductive channel between the pixel driving circuit and the anode on the one hand, and forms a micro-cavity structure on the other hand, which not only facilitates the control of a light-emitting device by the pixel driving circuit, but also makes the structure of the display substrate more compact, which is beneficial to the miniaturization of the silicon-based OLED display device. After this patterning process, the film-layer structure of the bonding region 300 does not change.

Figure 12:
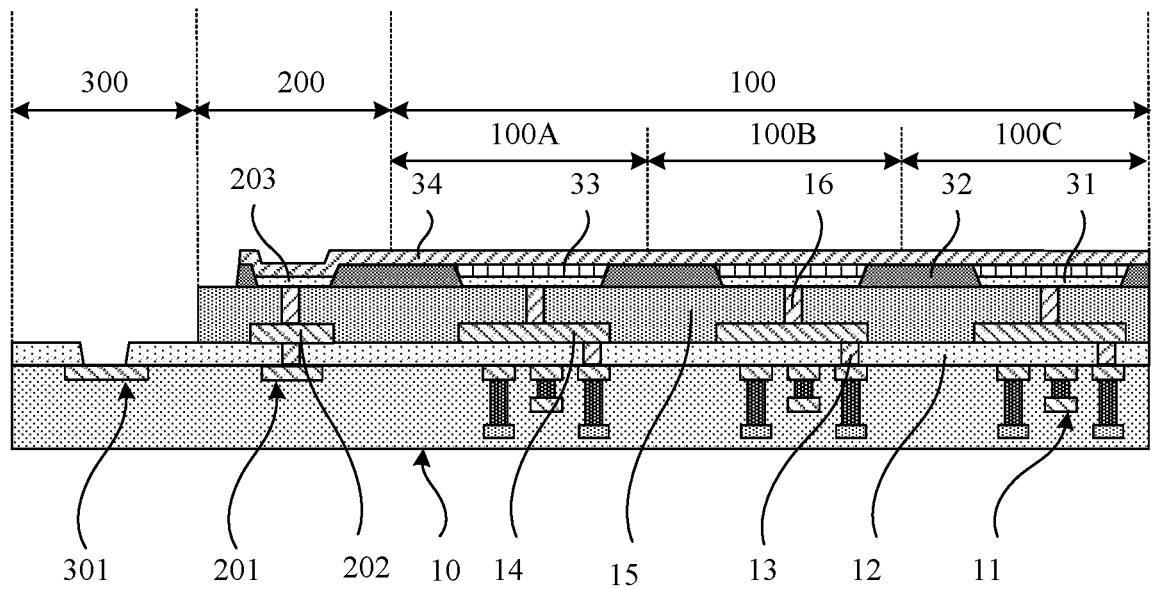
FIG. 12 is a schematic diagram of a display substrate after an organic light-emitting layer and a cathode are formed according to the present disclosure.

(6) A pixel definition film is coated on the silicon-based substrate 10 with the above structure formed, and a pattern of a pixel definition layer (PDL) 32 is formed in the display region 100 and the peripheral region 200 through mask, exposure and development processes. In each display unit of the display region 100, the pixel definition layer 32 is provided with a pixel opening exposing the surface of the anode 31. In the peripheral region 200, the pixel definition layer 32 is provided with a cathode via hole exposing the second intermediate electrode 203. Subsequently, an organic light-emitting layer 33 and a cathode 34 are sequentially formed in the display region 100. In each display unit of the display region 100, the organic light-emitting layer 33 is connected with the anode 31 of the display unit in which the organic light-emitting layer 33 is located. A planar cathode 34 is formed in the display region 100 and the peripheral region 200. The cathode 34 of the display region 100 is connected with the organic light-emitting layer 33 of each display unit through the pixel opening, and the cathode 34 of the peripheral region 200 is connected with the second intermediate electrode 203 through the cathode via hole, as shown in FIG. 12. Since the cathode 34 is connected with the second intermediate electrode 203 through the cathode via hole, the second intermediate electrode 203 is connected with the first intermediate electrode 202 through the second conductive pillar 16, and the first intermediate electrode 202 is connected with the power supply electrode 201 through the first conductive pillar 13, thus, the first intermediate electrode 202 and the second intermediate electrode 203 form a conductive channel between the cathode and the power supply electrode 201. The voltage signal provided by the power supply electrode 201 is transmitted to the cathode 34 through the conductive channel, thus achieving a cathode ring structure. In order to ensure etching uniformity, the pattern design of the cathode ring in the peripheral region 200 is consistent with that of the display region 100. In an exemplary embodiment, the cathode 34 is a semi-transmissive and semi-reflective electrode, and constitutes a micro-cavity structure with the aforementioned connection electrode 14 formed as a reflective electrode. After this patterning process, the film-layer structure of the bonding region 300 does not change.

In the aforementioned preparation process, the first insulating film and the second insulating film may adopt any one or more of silicon oxide (SiOx), silicon nitride (SiNx) and silicon oxynitride (SiON), and they may have a single-layer structure or a multi-layer composite structure. The first metal film may be made of a metal material including any one or more of silver (Ag), copper (Cu), aluminum (Al) and molybdenum (Mo), or may be made of an alloy material composed of metals, such as aluminum neodymium alloy (AlNd) or molybdenum niobium alloy (MoNb), or may have a multilayer composite structure, such as composite structure of Mo/Cu/Mo. The transparent conductive film can adopt indium tin oxide (ITO) or indium zinc oxide (IZO), or a composite structure of ITO/Ag/ITO, and the pixel definition layer can adopt polyimide, acrylic or polyethylene terephthalate.

Figure 13:
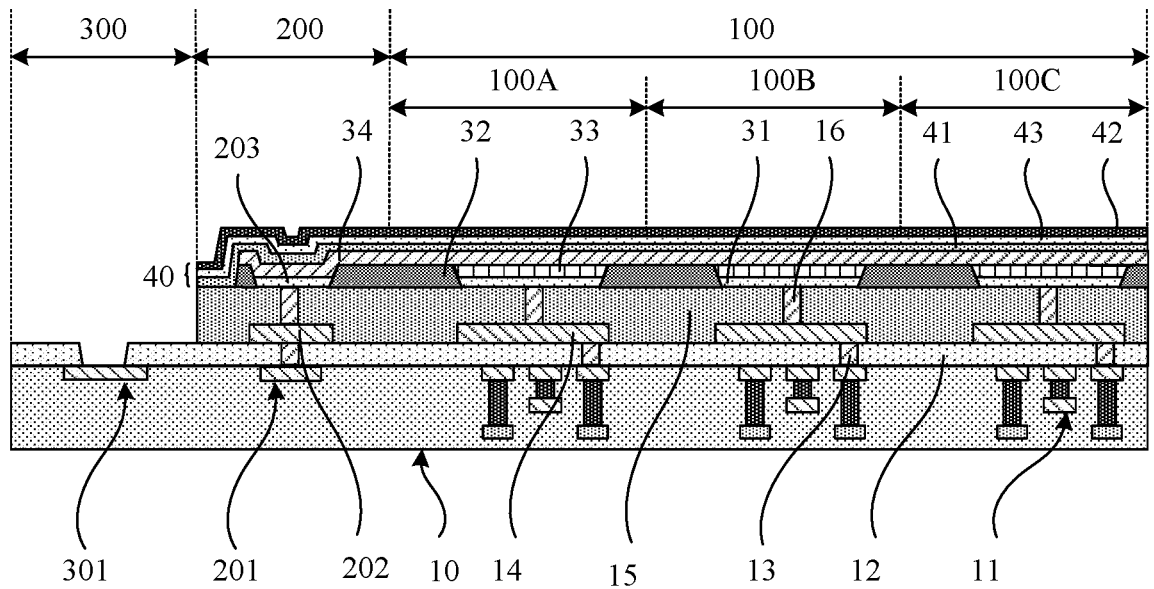
FIG. 13 is a schematic diagram of a display substrate after an encapsulation layer is formed according to the present disclosure.

(7) A pattern of an encapsulation layer is formed on the silicon-based substrate 10 with the aforementioned structure formed. The encapsulation layer is formed in the display region 100, which is a film encapsulation structure with material functional gradient change, and is completed by continuous deposition in the same chamber using a mask by CVD or PECVD equipment, as shown in FIG. 13. The encapsulation layer 40 includes a first gradient layer 41, a homogeneous layer 43, and a second gradient layer 42 which are sequentially stacked on the cathode 34. Along the direction away from the silicon-based substrate 10, the content of oxygen in the first gradient layer 41 gradually decreases, the content of each element in the homogeneous layer 43 remains unchanged, and the content of carbon in the second gradient layer 42 gradually increases.

In an exemplary embodiment, forming the pattern of the encapsulation layer 40 may include three time periods, and one material layer is prepared in each time period. The preparation process will be described in detail below.

A. Forming a First Gradient Layer 41 in a First Time Period T1.

At the beginning of the first time period T1, monosilane (SiH$_4$), nitrous oxide (N$_2$O), ammonia (NH$_3$) and nitrogen (N$_2$) are used for film layer deposition, the gas ratio of SiH$_4$, N$_2$O, NH3 and N$_2$ is 1:5:5:16, and the material of the formed film layer is silicon oxynitride (SiONx). After the start time, the proportion of N$_2$O in the total gas gradually decreases, and at the end time of the first time period T1, the proportion of N$_2$O in the total gas decreases to 0, and the material of the formed film layer is silicon nitride (SiNx). In this way, in the first gradient layer 41 formed in the first time period, the film layer adjacent to the cathode is a SiONx film layer, and the film layer away from the cathode is a SiNx film layer. The oxygen content in the material from SiONx to SiNx film layer gradually decreases until the oxygen content is 0.

In an exemplary embodiment, SiH$_4$ can be replaced with other silicon hydride gases, N$_2$O can be replaced with other nitrogen oxide compounds or oxygen compound gases, and NH$_3$ and N$_2$ can be replaced with other nitrogen hydrogen compounds or nitrogen compound gases. Taking the use of a silicon hydride gas, an oxygen compound gas, a nitrogen hydrogen compound gas and a nitrogen compound gas for film layer deposition as an example, the proportion of silicon hydride gas in the total gas may be 2% to 6%, the proportion of nitrogen oxide compound or oxygen compound gas in the total gas may be 14% to 22%, the proportion of nitrogen hydrogen compound gas in the total gas may be 14% to 22%, and the proportion of nitrogen compound gas in the total gas may be 50% to 70%. In some possible implementations, the proportion of silicon hydride gas in the total gas may be 4%, the proportion of nitrogen oxide compound or oxygen compound gas in the total gas may be 18%, the proportion of nitrogen hydrogen compound gas in the total gas may be 18%, and the proportion of nitrogen compound gas in the total gas may be 60%.

In some possible implementations, the proportion of N$_2$O in the total gas in the film layer deposition process can be continuously reduced in the first time period T1, or it can be stepwise reduced in the first time period T1. If continuous reduction is adopted, the reduction rate of the proportion of N$_2$O in the total gas can be $(T1_E - T1_B)/M1$, where $T1_B$ is the start time of the first time period, $T1_E$ is the end time of the first time period, and M1 is the proportion of N$_2$O in the total gas at the start time. If stepwise reduction is adopted, the first time period T1 can be divided into N sub-time periods, and the duration of each sub-time period is $(T1_E - T1_B)/N$. In the $i^{th}$ sub-time period, the proportion of N$_2$O in the total gas is $M1 - (i-1)*M1/(N-1)$, and i=1 to N. In some possible implementations, M1 is 14% to 22%, N is 3 to 10, and T1 is 50 s to 150 s.

In some possible implementations, the proportion of N$_2$O in the total gas can be reduced by reducing the supply of N$_2$O, or by reducing the supply of N$_2$O and increasing the supply of SiH$_4$, NH$_3$ and N$_2$, which is not limited by the present disclosure.

B. Forming a Homogeneous Layer 43 in the Second Time Period T2.

At the end of the first time period T1, in the deposition gas, the proportion of N$_2$O in the total gas decreases to 0, so at the beginning of the second time period T2, SiH$_4$, NH$_3$ and N$_2$ are used for film layer deposition, and the material of the formed film layer is SiNx. In the process of film layer deposition, the gas ratio of SiH$_4$, NH$_3$ and N$_2$ is unchanged, and at the end of the second time period T2, the material of the formed film layer is still SiNx. In this way, in the homogeneous layer 43 formed in the second time period, the film layers adjacent to the first gradient layer 41 and away from the first gradient layer 41 are both SiNx film layers, and the content of each element in the film layer material is unchanged. In some possible implementations, the second time period T2 is 50 s to 150 s.

In an exemplary embodiment, SiH$_4$ can be replaced with other silicon hydride gases, and NH$_3$ and N$_2$ can be replaced with other nitrogen hydrogen compounds or nitrogen compound gases. In some possible implementations, the gas ratio of SiH$_4$, NH$_3$ and N$_2$ can be changed during the film layer deposition in the second time period T2 to change the film layer characteristics of the homogeneous layer and meet the requirements of refractive index or transmittance of the encapsulation layer.

C. Forming a Second Gradient Layer 42 in the Third Time Period T3.

At the end of the second time period T2, the deposition gas includes SiH$_4$, NH$_3$ and N$_2$, so at the beginning of the third time period T3, SiH$_4$, NH$_3$ and N$_2$ are used for film layer deposition, and the material of the formed film layer is SiNx. After the start time, acetylene (C$_2$H$_2$) is added to the deposition gas, and the proportion of C$_2$H$_2$ in the total gas is gradually increased. At the end time of the third time period T3, the gas ratio of SiH$_4$, C$_2$H$_2$, NH$_3$ and N$_2$ is 1:1:2:4, and the material of the formed film layer is silicon carbide (SiC) or silicon carbon nitrogen (SiCNx). In this way, in the second gradient layer 42 formed in the third time period, the film layer adjacent to the homogeneous layer 43 is a SiNx film layer, the film layer away from the homogeneous layer 43 is a SiC/SiCNx film layer, and the proportion of the carbon content in the material between the SiNx film layer and the SiC/SiCNx film layer gradually increases from 0 to 12.5% of the total gas.

In an exemplary embodiment, SiH$_4$ can be replaced with other silicon hydride gases, C$_2$H$_2$ can be replaced with other hydrocarbons, and NH$_3$ and N$_2$ can be replaced with other nitrogen hydrogen compounds or nitrogen compound gases. Taking the use of a silicon hydride gas, a hydrocarbon, a nitrogen hydrogen compound gas and a nitrogen compound gas for film layer deposition as an example, the proportion of silicon hydride gas in the total gas may be 10% to 15%, the proportion of hydrocarbon gas in the total gas may be 10% to 15%, the proportion of nitrogen hydrogen compound gas in the total gas may be 20% to 30%, and the proportion of nitrogen compound gas in the total gas may be 40% to 60%. In some possible implementations, the proportion of silicon hydride gas in the total gas may be 12.5%, the proportion of hydrocarbon gas in the total gas may be 12.5%, the proportion of nitrogen hydrogen compound gas in the total gas may be 25%, and the proportion of nitrogen compound gas in the total gas may be 50%.

In some possible implementations, the proportion of C$_2$H$_2$ in the total gas is increased during the film layer deposition process, which can be continuously increased in the third time period T3, or can be stepwise increased in the third time period T3. If continuous increase is adopted, the increasing rate of the proportion of C$_2$H$_2$ in the total gas can be (T3$_E$-T3$_B$)/M3, where T3$_B$ is the start time of the third time period, T3$_E$ is the end time of the third time period, and M3 is the proportion of C2H2 in the total gas at the end time. If stepwise increase is adopted, the third time period T3 can be divided into N sub-time periods, and the duration of each sub-time period is (T3$_E$-T3$_B$)/N. In the i$^{th}$ sub-time period, the proportion of C2H2 in the total gas is (i−1)*M3/(N−1), i=1 to N. In some possible implementations, M3 is 10% to 15%, N is 3 to 10, and T3 is 20 s to 60 s.

In this way, by continuously depositing in the same CVD or PECVD equipment in the present disclosure, a film layer with gradually changed oxygen content and carbon content is formed by adjusting different combinations of deposition gases and the proportion of each component in the combination, and an encapsulation layer with material functional gradient change is prepared, as shown in FIG. 13. As CVD or PECVD process equipment is adopted in the encapsulation layer in the present disclosure, a mask can be used in the process of forming an encapsulation structure. No encapsulation layer is formed in the bonding region 300 and the cutting track due to the shielding by the mask. Since the formed encapsulation layer is not a whole-face structure, not only the encapsulation layer will not be cut in the subsequent cutting process, thereby avoiding the occurrence of cracks in the encapsulation layer, but also the subsequent process of opening the bonding region is avoided, thereby eliminating the risk of encapsulation failure and improving the reliability of the module.

Since the first gradient layer 41 has inorganic characteristics, it not only has good encapsulation characteristics, but also has good adhesion with the cathode, thus ensuring the wrapping effect of the encapsulation layer and the encapsulation effect of isolating water and oxygen. The homogeneous layer 43 has inorganic characteristics, and good encapsulation characteristics can further ensure the encapsulation effect. The second gradient layer 42 has organic characteristics, which not only has better organic encapsulation characteristics, but also has better particle coating ability, and thus it can well coat the particles on the film layer, and prevent the film layer from piercing, thereby ensuring the process quality and the product quality. In addition, SiC/SiCNx material with organic characteristics can well release the stress between inorganic layers, and prevent the film layer from generating microcracks or peeling defects due to high stress. The SiC/SiCNx material also has good flat characteristics, which can provide a flat substrate for the subsequent manufacture of the color filter layer and prevent the damage to the first gradient layer and the homogeneous layer during the manufacture of the color filter layer.

In an exemplary embodiment, the thickness of the first gradient layer 41 is smaller than that of the second gradient layer 42, and the thickness of the homogeneous layer 43 is smaller than that of the second gradient layer 42. In some possible implementations, the thickness of the encapsulation layer 40 is 1 μm to 5 μm, the thickness of the first gradient layer 41 is 0.25 μm to 1.25 μm, the thickness of the homogeneous layer 43 is 0.25 μm to 1.25 μm, and the thickness of the second gradient layer 42 is 0.5 μm to 2.5 μm. In some possible implementations, the thickness of the encapsulation layer 40 is 2 μm, the thickness of the first gradient layer 41 is 0.5 μm, the thickness of the homogeneous layer 43 is 0.5 μm, and the thickness of the second gradient layer 42 is 1 μm. Compared with the encapsulation structure formed by adopting an inkjet printing mode, the thickness of the encapsulation layer is reduced in the present disclosure, so that the total thickness of the silicon-based OLED display device is reduced. In some possible implementations, the thickness of the encapsulation layer 40 can be determined according to the light-emitting requirements, display performance and encapsulation requirements.

In an exemplary embodiment, the time for preparing the encapsulation layer 40 is 2 to 4 minutes, the first time period T1 for preparing the first gradient layer 41 is 0.75 to 1.5 minutes, the second time period T2 for preparing the homogeneous layer 43 is 0.75 to 1.5 minutes, and the third time period T3 for preparing the second gradient layer 42 is 0.5 to 1 minute. In some possible implementations, the time for preparing the encapsulation layer 40 is 3 minutes, the first time period T1 for preparing the first gradient layer 41 is 1.25 minutes, the second time period T2 for preparing the homogeneous layer 43 is 1.25 minutes, and the third time period T3 for preparing the second gradient layer 42 is 0.5 minutes. The pressure of the encapsulation layer preparation process can be changed according to the change of gas flow rate, for example, the pressure can be 1000 mtorr to 2000 mtorr.

Figure 14:
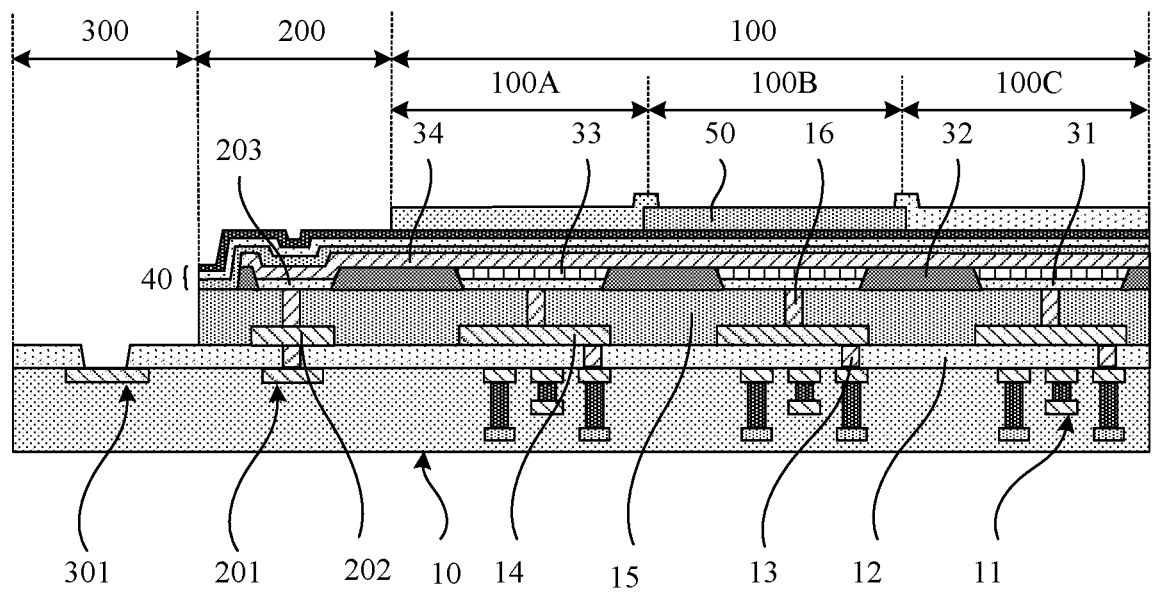
FIG. 14 is a schematic diagram of a display substrate after a color filter layer is formed according to the present disclosure.

(8) A pattern of a color filter layer 50 is formed on the silicon-based substrate 10 with the aforementioned structure formed, and the color filter layer 50 is disposed in the display region 100 and includes a first color unit, a second color unit and a third color unit corresponding to the display unit, as shown in FIG. 14. In an exemplary embodiment, each color unit in the color filter layer 50 may overlap each other as a black matrix, or a black matrix may be disposed between each color unit. In an exemplary embodiment, the first color unit may be a green unit, the second color unit may be a red unit, and the third color unit may be a blue unit. In some possible implementations, the preparation process of the color filter layer 50 includes forming a blue unit first, then a red unit, and then a green unit. The adhesion of the blue color filter is high, and the possibility of peeling off the color filter layer 50 from the cathode can be reduced by forming the blue unit first. Because the red unit has low adhesion but good fluidity, the number of bubbles on the surfaces of the side of the blue unit and the red unit away from the cathode can be reduced in the process of forming the red unit, so that the uniformity of film thickness at the overlapping position of the blue unit and the red unit can be improved. Since the base material of the green unit is approximately the same as that of the red unit, the adhesion between the green unit and the red unit is large, and the possibility of peeling off the color filter layer 50 from the cathode can be reduced. In some possible implementations, the color filter layer 50 may include other color units, such as white or yellow.

Figure 15:
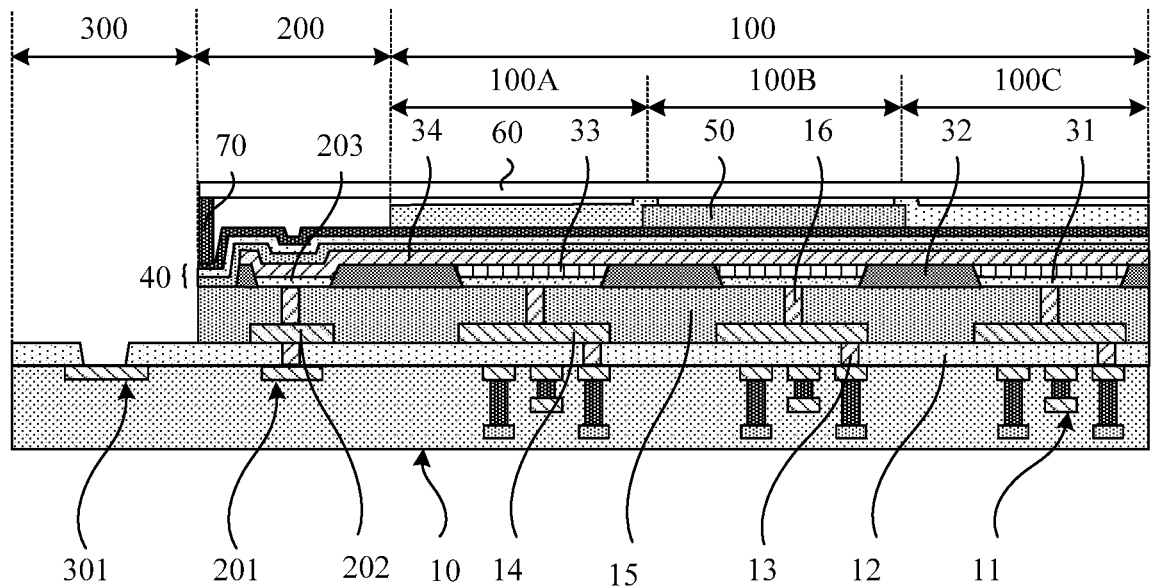
FIG. 15 is a schematic diagram of a display substrate after a cover panel is formed according to the present disclosure.

In the subsequent process, a cover panel 60 is formed by a sealing process, and the cover panel 60 and the silicon-based substrate 10 are fixed by a sealant 70, as shown in FIG. 15. After the above process is completed, the film-layer structure of the bonding region 300 does not change. As the silicon-based substrate 10, the cover panel 60 and the sealant 70 together form a closed space, the protection against water and oxygen is additionally provided, and the service life of the silicon-based OLED display substrate is greatly prolonged. Subsequently, the formed display motherboard is cut to form an independent display substrate. Since the encapsulation layer 40 is formed by the deposition process of the mask, it can be controlled that the encapsulation layer is not formed in the bonding region 300 and the cutting track, so that the encapsulation layer will not be cut in the subsequent cutting process of the display motherboard, thereby avoiding the occurrence of cracks in the encapsulation layer. Since there is no encapsulation layer in the bonding region 300, the subsequent processing of opening the bonding region 300 is unnecessary, thus avoiding the risk of encapsulation failure and improving the reliability of the module.

Figure 16:
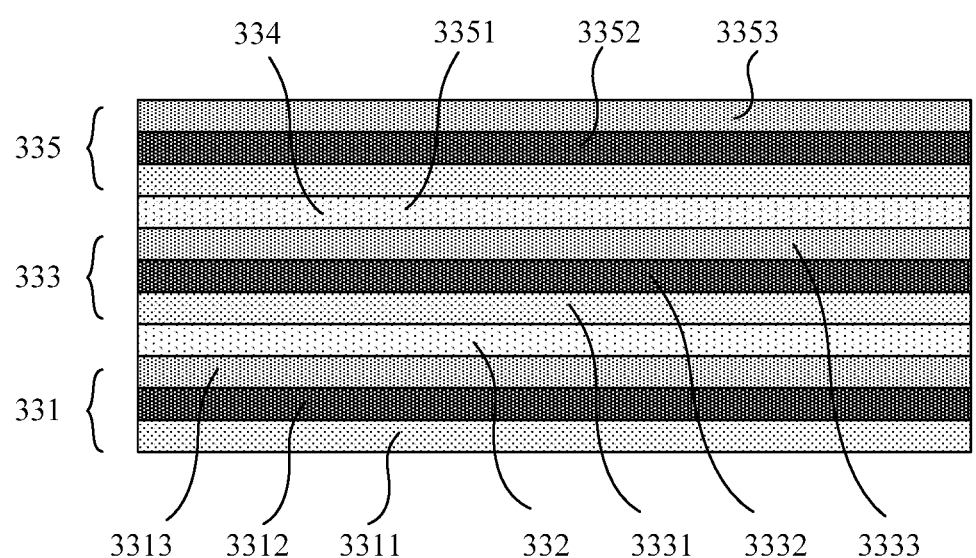
FIG. 16 is a schematic diagram of a structure of an organic light-emitting layer according to the present disclosure.

FIG. 16 is a schematic diagram of a structure of an organic light-emitting layer according to the present disclosure. As shown in FIG. 16, the structure of the organic light-emitting layer of the present disclosure includes a first light-emitting sub-layer 331, a first charge generation layer 332, a second light-emitting sub-layer 333, a second charge generation layer 334 and a third light-emitting sub-layer 335 which are sequentially stacked between the anode and the cathode. The first light-emitting sub-layer 331 is configured to emit light of a first color, and includes a first hole transporting layer (HTL) 3311, a first light-emitting material layer (EML) 3312, and a first electron transporting layer (ETL) 3313 which are sequentially stacked. The second light-emitting sub-layer 333 is configured to emit light of a second color, and includes a second hole transport layer 3331, a second light-emitting material layer 3332 and a second electron transport layer 3333 which are sequentially stacked. The third light-emitting sub-layer 335 is configured to emit light of a third color, and includes a third hole transport layer 3351, a third light-emitting material layer 3352 and a third electron transport layer 3353 which are sequentially stacked. The first charge generating layer 332 is disposed between the first light-emitting sub-layer 331 and the second light-emitting sub-layer 333, and is configured to connect the two light-emitting sub-layers in series to achieve carrier transfer. The second charge generating layer 334 is disposed between the second light-emitting sub-layer 333 and the third light-emitting sub-layer 335, and is configured to connect the two light-emitting sub-layers in series to achieve carrier transfer. Since in the present disclosure, the organic light-emitting layer includes a first light-emitting material layer emitting light of a first color, a second light-emitting material layer emitting light of a second color, and a third light-emitting material layer emitting light of a third color, the light eventually emitted by the organic light-emitting layer is mixed light. For example, it may be disposed that the first light-emitting material layer is a red light material layer emitting red light, the second light-emitting material layer is a green light material layer emitting green light, and the third light-emitting material layer is a blue light material layer emitting blue light, and therefore, the light-emitting layer eventually emits white light.

In an exemplary embodiment, the organic light-emitting layer shown in FIG. 16 is only an exemplary structure, which is not limited by the present disclosure. In practice, the structure of the organic light-emitting layer can be designed according to actual needs. For example, in each light-emitting sub-layer, in order to improve the efficiency of injecting electrons and holes into the light-emitting material layer, a Hole Injection Layer (HIL) and an Electron Injection Layer (EIL) may also be provided. For another example, in order to simplify the structure of the organic light-emitting layer, the first electron transport layer 3313, the first charge generating layer 332, and the second hole transport layer 3331 may be canceled, that is, the second light-emitting material layer 3332 can be disposed directly on the first light-emitting material layer 3312.

In some possible implementations, the organic light-emitting layer can adopt an organic light-emitting layer emitting light of a first color and an organic light-emitting layer emitting the complementary light of the light of the first color, and the two organic light-emitting layers are sequentially stacked relative to the silicon-based substrate to emit white light as a whole, which is not limited by the present disclosure as long as white light emission can be achieved.

It can be seen from the structure and preparation process of the display substrate described above that the encapsulation layer is formed by continuous deposition in the same CVD or PECVD chamber, which avoids the use of various equipment, reduces the process complexity, improves the film layer deposition rate, shortens the tact time, reduces the production cost, and is beneficial to mass production. By adjusting different combinations of gases and the proportion of each component in the combination in continuous deposition, an encapsulation layer with material functional gradient changes is formed. The earlier formed film layer has inorganic characteristics, and good encapsulation characteristics can ensure the encapsulation effect of the encapsulation layer. The later formed film has organic characteristics, which not only has good particle coating ability and well releases the stress between inorganic layers, but also has good flatness characteristics, thereby ensuring the process quality and product quality. Encapsulation of a single display substrate is achieved by using a mask for deposition. Since no encapsulation layer is formed in the bonding region and the cutting track of the display substrate, not only the encapsulation layer will not be cut in the subsequent cutting process, thereby avoiding the occurrence of cracks in the encapsulation layer, but also other processes are not needed to open the bonding region, thereby saving the process flow, eliminating the risk of encapsulation failure and improving the reliability of the module.

The preparation process of the present disclosure can be achieved by using mature preparation equipment, has small improvement on the process and high compatibility, simple process flow, is easy for periodic maintenance of equipment, has high production efficiency, low production cost, high yield and convenience for mass production. The prepared display substrate can be applied to virtual reality equipment or enhanced display equipment or can be applied to other types of display devices, and has good application prospects.

Figure 17:
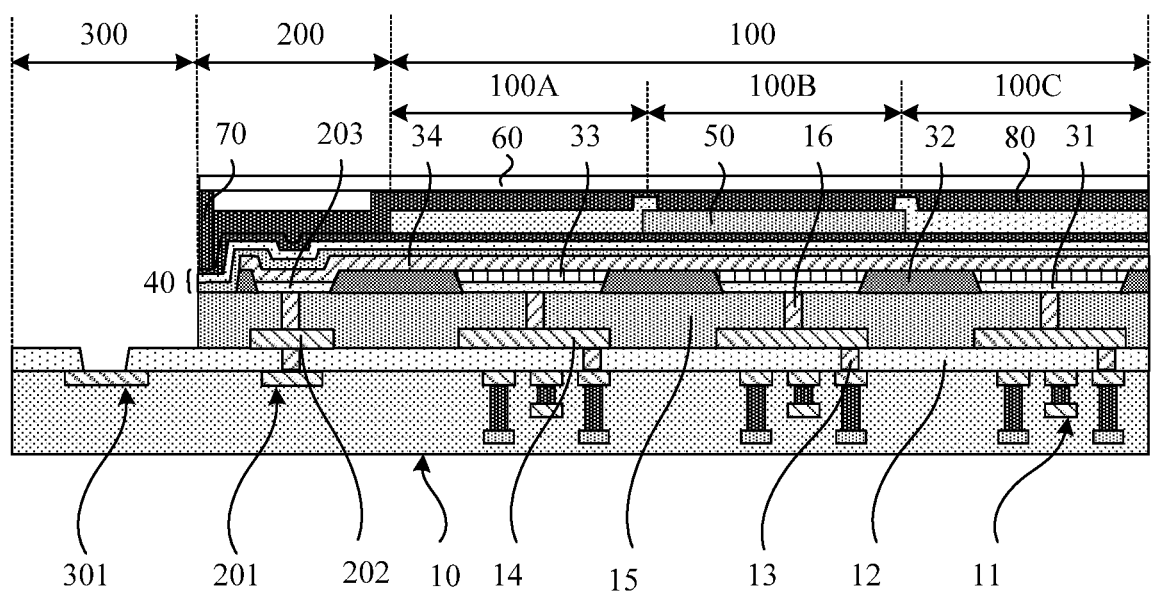
FIG. 17 is a schematic cross-sectional view of another structure of a display substrate according to the present disclosure.

FIG. 17 is a schematic cross-sectional view of another structure of a display substrate according to the present disclosure. As shown in FIG. 17, a display region 100 of a display substrate includes a silicon-based substrate 10, a light-emitting element 20 disposed on the silicon-based substrate 10, an encapsulation layer 40 wrapping the light-emitting element 20, a color filter layer 50 disposed on the encapsulation layer 40, and a protective layer 80 disposed on the color filter layer 50. The protective layer 80 covers the color filter layer 50 of the display region 100 and the encapsulation layer 40 of the peripheral region 200. In an exemplary embodiment, the protective layer 80 may adopt at least one of SiC and SiCNx. Since SiC or SiCNx tend to have inorganic characteristics, on the one hand, it can protect the color filter layer 50, reduce the aging damage of the color filter layer 50, and prolong the service life, and on the other hand, it can form a flat surface, which is convenient for leveling the glue material in the subsequent process of attaching the cover panel and improves the attaching quality of the cover panel.

In an exemplary embodiment, the structures of the silicon-based substrate 10, the light-emitting element 20, the encapsulation layer 40, the color filter layer 50, and the peripheral region 200 and the bonding region 300 are the same as those of the previous embodiments, so the description thereof is omitted here. In the preparation process of the display substrate, after a pattern of the color filter layer is formed, a protective layer 80 is formed on the color filter layer first, and then a cover panel 60 is formed by the sealing process.

The structure and the preparation process thereof shown in the present disclosure are only an exemplary description. In an exemplary embodiment, the corresponding structure can be changed and the patterning process can be increased or decreased according to actual needs. For example, the length of the micro-cavity structure of each display unit may be the same or may be different. In another example, in the process of forming a connection electrode in the display region, a corresponding bonding pad may be formed in the bonding region. For another example, the connection electrode formed in the display region may not be used as the reflective electrode, but the reflective electrode and the anode are prepared together in the process of preparing the anode, which is not specifically limited in the present disclosure.

The present disclosure further provides a preparation method of a display substrate, including:

S1, forming a driving circuit and a light-emitting element on a base substrate; wherein the driving circuit is connected with the light-emitting element and configured to drive the light-emitting element, and the driving circuit comprises a driving transistor which comprises an active layer located inside the base substrate; and S2, forming an encapsulation layer by continuous deposition in a same equipment chamber, wherein the encapsulation layer comprises a first gradient layer and a second gradient layer which are sequentially formed along a direction away from the base substrate, a content of oxygen element in the first gradient layer gradually decreases and a content of carbon element in the second gradient layer gradually increases along the direction away from the base substrate.

In an exemplary embodiment, step S2 includes: in a same equipment chamber, forming a first gradient layer on the light-emitting element, wherein a content of oxygen element in the first gradient layer gradually decreases along a direction away from the light-emitting element;

forming a homogeneous layer on the first gradient layer, wherein a content of each element in the homogeneous layer is unchanged; and forming a second gradient layer on the homogeneous layer, wherein a content of carbon element in the second gradient layer gradually increases along the direction away from the light-emitting element.

In an exemplary embodiment, forming a first gradient layer on the light-emitting element includes:

adopting a silicon hydride gas, an oxygen compound gas, a nitrogen hydride gas and a nitrogen compound gas to perform film layer deposition, wherein a proportion of the oxygen compound gas in the total gas is gradually reduced to 0 in the deposition process such that the material of the first gradient layer adjacent to the light-emitting element comprises silicon oxynitride, and the material of the first gradient layer away from the light-emitting element comprises silicon nitride; and at the beginning of deposition, a proportion of the silicon hydride gas in the total gas is 2% to 6%, a proportion of the oxygen compound gas in the total gas is 14% to 22%, a proportion of the nitrogen gas in the total gas is 14% to 22%, and a proportion of the nitrogen compound gas in the total gas is 50% to 70%.

In an exemplary embodiment, monosilane may be used as the silicon hydride gas, the proportion of which in the total gas may be 4%; nitrous oxide may be used as the nitrogen oxide compound, the proportion of which in the total gas may be 18%; ammonia may be used as the nitrogen hydride gas, the proportion of which in the total gas may be 18%; and nitrogen may be used as the nitrogen compound gas, the proportion of which in the total gas may be 60%.

In an exemplary embodiment, forming a homogeneous layer on the first gradient layer includes:

adopting a silicon hydride gas and a nitrogen compound gas to perform film layer deposition, and forming a silicon nitride layer on the first gradient layer.

In an exemplary embodiment, forming a second gradient layer on the homogeneous layer includes:

adopting a silicon hydride gas, a hydrocarbon gas, a nitrogen hydride gas and a nitrogen compound gas to perform film layer deposition, wherein a proportion of the carbon compound gas in the total gas gradually increases from 0 such that a material of the second gradient layer adjacent to the light-emitting element comprises silicon nitride, and a material of the second gradient layer away from the light-emitting element comprises at least one of silicon carbide and silicon carbon nitrogen; and at the end of deposition, a proportion of the silicon hydride gas in the total gas is 10%-15%, a proportion of the hydrocarbon gas in the total gas is 10%-15%, a proportion of the nitrogen hydride gas in the total gas is 20%-30%, and a proportion of the nitrogen compound gas in the total gas is 40%-60%.

In an exemplary embodiment, monosilane may be used as the silicon hydride gas, the proportion of which in the total gas may be 12.5%; acetylene may be used as the hydrocarbon gas, the proportion of which in the total gas may be 12.5%; ammonia may be used as the nitrogen and hydrogen compound gas, the proportion of which in the total gas may be 12.5%; and nitrogen may be used as the nitrogen compound gas, the proportion of which in the total gas may be 50%.

In an exemplary embodiment, the thickness of the first gradient layer is smaller than that of the second gradient layer, and the thickness of the homogeneous layer is smaller than that of the second gradient layer.

In an exemplary embodiment, the display substrate includes a display region and a bonding region. Forming an encapsulation layer by continuous deposition in a same equipment chamber comprises:

adopting a mask to form an encapsulation layer by continuous deposition in the same equipment chamber.

In an exemplary embodiment, after step S2, the method further comprises:

forming a color filter layer on the encapsulation layer; and forming a protective layer on the color filter layer, wherein a material of the protective layer comprises at least one of silicon carbide and silicon carbon nitrogen.

The present disclosure further provides a display device, comprising the aforementioned display substrate. The display device can be a virtual reality device, an augmented reality device or a near-eye display device, or can be a mobile phone, a tablet computer, a television, a display, a notebook computer, a digital photo frame or a navigator, or any other product or component with a display function.

Although implementations disclosed in the present disclosure are as the above, the described contents are only implementations used for facilitating understanding the present disclosure, and are not used to limit the present disclosure. Any person skilled in the field to which the present disclosure pertains may make any modifications and variations in the forms and details of implementation without departing from the spirit and the scope disclosed by the present disclosure. However, the patent protection scope of the present disclosure shall still be subject to the scope defined in the appended claims.

What we claim is:

1. A display substrate, comprising:
    a base substrate, a light-emitting element disposed on the base substrate, and an encapsulation layer disposed on the light-emitting element, wherein:
    the display substrate further comprises a driving circuit connected with the light-emitting element and configured to drive the light-emitting element, the driving circuit comprises a driving transistor which comprises an active layer located inside the base substrate;
    the encapsulation layer comprises a first gradient layer and a second gradient layer stacked along a direction away from the base substrate;
    in a direction perpendicular to the base substrate and from a layer where the base substrate is located to a layer where an uppermost layer of the display substrate is located, a content of oxygen element in the first gradient layer of the encapsulation layer gradually decreases;
    in the direction perpendicular to the base substrate and from the layer where the base substrate is located to the layer where the uppermost layer of the display substrate is located, a content of carbon element in the second gradient layer of the encapsulation layer gradually increases; and
    the encapsulation layer comprising the first gradient layer and the second gradient layer is formed with a structure of material functional gradient change.

2. The display substrate according to claim 1, wherein elements in the first gradient layer comprise silicon, oxygen and nitrogen, a material of the first gradient layer adjacent to the light-emitting element comprises silicon oxynitride, and a material of the first gradient layer away from the light-emitting element comprises silicon nitride.

3. The display substrate according to claim 1, wherein elements in the second gradient layer comprise silicon, carbon and nitrogen, a material of the second gradient layer adjacent to the light-emitting element comprises silicon nitride, and a material of the second gradient layer away from the light-emitting element comprises at least one of silicon carbide and silicon carbon nitrogen.

4. The display substrate according to claim 1, wherein the encapsulation layer further comprises a homogeneous layer disposed between the first gradient layer and the second gradient layer, and a content of each element in the homogeneous layer is unchanged.

5. The display substrate according to claim 4, wherein a material of the homogeneous layer comprises silicon nitride.

6. The display substrate according to claim 4, wherein a thickness of the first gradient layer is smaller than a thickness of the second gradient layer, and a thickness of the homogeneous layer is smaller than the thickness of the second gradient layer.

7. The display substrate according to claim 1, wherein the display substrate further comprises a color filter layer and a protective layer, the color filter layer is disposed on the second gradient layer, the protective layer is disposed on the color filter layer, and a material of the protective layer comprises at least one of silicon carbide and silicon carbon nitrogen.

8. A display device, comprising the display substrate according to claim 1.

9. The display substrate according to claim 2, wherein the encapsulation layer further comprises a homogeneous layer disposed between the first gradient layer and the second gradient layer, and a content of each element in the homogeneous layer is unchanged.

10. The display substrate according to claim 3, wherein the encapsulation layer further comprises a homogeneous layer disposed between the first gradient layer and the second gradient layer, and a content of each element in the homogeneous layer is unchanged.

11. The display substrate according to claim 2, wherein the display substrate further comprises a color filter layer and a protective layer, the color filter layer is disposed on the second gradient layer, the protective layer is disposed on the color filter layer, and a material of the protective layer comprises at least one of silicon carbide and silicon carbon nitrogen.

12. The display substrate according to claim 3, wherein the display substrate further comprises a color filter layer and a protective layer, the color filter layer is disposed on the second gradient layer, the protective layer is disposed on the color filter layer, and a material of the protective layer comprises at least one of silicon carbide and silicon carbon nitrogen.

13. A preparation method of a display substrate, comprising:
forming a driving circuit and a light-emitting element on a base substrate, wherein the driving circuit is connected with the light-emitting element and configured to drive the light-emitting element, and the driving circuit comprises a driving transistor which comprises an active layer located inside the base substrate; and
forming an encapsulation layer by continuous deposition in a same equipment chamber, wherein the encapsulation layer comprises a first gradient layer and a second gradient layer which are sequentially formed along a direction away from the base substrate,
wherein:
in a direction perpendicular to the base substrate and from a layer where the base substrate is located to a layer where an uppermost layer of the display substrate is located, a content of oxygen element in the first gradient layer of the encapsulation layer gradually decreases;
in the direction perpendicular to the base substrate and from the layer where the base substrate is located to the layer where the uppermost layer of the display substrate is located, a content of carbon element in the second gradient layer of the encapsulation layer gradually increases; and
the encapsulation layer comprising the first gradient layer and the second gradient layer is formed with a structure of material functional gradient change.

14. The preparation method according to claim 13, wherein forming the encapsulation layer by continuous deposition in the same equipment chamber comprises: in the same equipment chamber,
forming the first gradient layer on the light-emitting element, wherein the content of oxygen element in the first gradient layer gradually decreases along the direction away from the base substrate;
forming a homogeneous layer on the first gradient layer, wherein a content of each element in the homogeneous layer is unchanged; and
forming the second gradient layer on the homogeneous layer, wherein the content of carbon element in the second gradient layer gradually increases along the direction away from the substrate.

15. The preparation method according to claim 14, wherein forming the first gradient layer on the light-emitting element comprises:
adopting a silicon hydride gas, an oxygen compound gas, a nitrogen hydride gas and a nitrogen compound gas to perform film layer deposition, wherein a proportion of the oxygen compound gas in a total gas is gradually reduced to 0 in the deposition process, to make a material of the first gradient layer adjacent to the light-emitting element comprise silicon oxynitride, and a material of the first gradient layer away from the light-emitting element comprise silicon nitride; and at a beginning of the deposition, a proportion of the silicon hydride gas in the total gas is 2% to 6%, a proportion of the oxygen compound gas in the total gas is 14% to 22%, a proportion of the nitrogen hydride gas in the total gas is 14% to 22%, and a proportion of the nitrogen compound gas in the total gas is 50% to 70%.

16. The preparation method according to claim 14, wherein forming the homogeneous layer on the first gradient layer comprises:
adopting a silicon hydride gas and a nitrogen compound gas to perform film layer deposition, and forming a silicon nitride layer on the first gradient layer.

17. The preparation method according to claim 14, wherein forming the second gradient layer on the homogeneous layer comprises:
adopting a silicon hydride gas, a hydrocarbon gas, a nitrogen hydride gas and a nitrogen compound gas to perform film layer deposition, wherein a proportion of a carbon compound gas in a total gas gradually increases from 0 in the deposition process, to make a material of the second gradient layer adjacent to the light-emitting element comprise silicon nitride, and a material of the second gradient layer away from the light-emitting element comprise at least one of silicon carbide and silicon carbon nitrogen; and at an end of the deposition, a proportion of the silicon hydride gas in the total gas is 10%-15%, a proportion of the hydrocarbon gas in the total gas is 10%-15%, a proportion of the nitrogen hydride gas in the total gas is 20%-30%, and a proportion of the nitrogen compound gas in the total gas is 40%-60%.

18. The preparation method according to claim 13, wherein the display substrate further comprises a display region and a bonding region; and forming the encapsulation layer by continuous deposition in the same equipment chamber comprises:
adopting a mask to form the encapsulation layer by continuous deposition in the same equipment chamber.

19. The preparation method according to claim 13, wherein the preparation method further comprises:
forming a color filter layer on the encapsulation layer; and
forming a protective layer on the color filter layer, wherein a material of the protective layer comprises at least one of silicon carbide and silicon carbon nitrogen.

20. The preparation method according to claim 14, wherein the display substrate further comprises a display region and a bonding region; and forming the encapsulation layer by continuous deposition in the same equipment chamber comprises:
adopting a mask to form the encapsulation layer by continuous deposition in the same equipment chamber.

* * * * *